(12) United States Patent
Kaner et al.

(10) Patent No.: US 12,419,020 B2
(45) Date of Patent: Sep. 16, 2025

(54) ELECTROMAGNETIC INTERFERENCE SHIELDING MATERIALS, DEVICES, AND METHODS OF MANUFACTURE THEREOF

(71) Applicant: NANOTECH ENERGY, INC., Sunny Isles Beach, FL (US)

(72) Inventors: Richard B. Kaner, Pacific Palisades, CA (US); Maher F. El-Kady, Los Angeles, CA (US); Jack Kavanaugh, Los Angeles, CA (US); Scott Laine, Chico, CA (US)

(73) Assignee: Nanotech Energy, Inc., Sunny Isles Beach, FL (US)

( * ) Notice: Subject to any disclaimer, the term of this patent is extended or adjusted under 35 U.S.C. 154(b) by 137 days.

(21) Appl. No.: 18/063,524

(22) Filed: Dec. 8, 2022

(65) Prior Publication Data

US 2023/0255011 A1 Aug. 10, 2023

Related U.S. Application Data

(62) Division of application No. 17/139,804, filed on Dec. 31, 2020, now Pat. No. 11,553,630.

(60) Provisional application No. 62/957,030, filed on Jan. 3, 2020, provisional application No. 62/957,035, filed on Jan. 3, 2020.

(51) Int. Cl.
*H05K 9/00* (2006.01)
*H05K 1/03* (2006.01)

(52) U.S. Cl.
CPC ............ *H05K 9/0081* (2013.01); *H05K 1/03* (2013.01); *H05K 2201/0707* (2013.01); *H05K 2201/10371* (2013.01)

(58) Field of Classification Search
None
See application file for complete search history.

(56) References Cited

U.S. PATENT DOCUMENTS

| | | | | |
|---|---|---|---|---|
| 6,265,466 | B1 * | 7/2001 | Glatkowski | G21F 1/10 977/734 |
| 11,553,630 | B2 | 1/2023 | Kaner et al. | |
| 2003/0057402 | A1 * | 3/2003 | Schneck | H01B 1/24 252/511 |
| 2003/0181328 | A1 * | 9/2003 | Hwang | D01F 9/127 423/447.3 |

(Continued)

FOREIGN PATENT DOCUMENTS

| | | |
|---|---|---|
| CN | 105068162 A | 11/2015 |
| CN | 106147514 A | 11/2016 |

(Continued)

OTHER PUBLICATIONS

Liang et al.: Superior electromagnetic interference shielding 3D graphene nanoplatelets/reduced graphene oxide foam/epoxy nanocomposites with high thermal conductivity [Abstract only] J. Mater. Chem. C 7:2725-2733 (2019).

(Continued)

*Primary Examiner* — Michael P. Rodriguez
(74) *Attorney, Agent, or Firm* — Polygon IP, LLP

(57) ABSTRACT

Described are electromagnetic shields comprising a substrate, a conductive additive, and a binder incorporated with the conductive additive and deposited on the substrate, and methods of making thereof.

20 Claims, 15 Drawing Sheets

(56) References Cited

U.S. PATENT DOCUMENTS

| | | | |
|---|---|---|---|
| 2005/0241951 A1* | 11/2005 | Crouse | C23C 18/1608 |
| | | | 205/167 |
| 2006/0083948 A1 | 4/2006 | Kawaguchi et al. | |
| 2010/0096181 A1* | 4/2010 | Nakamura | B32B 7/12 |
| | | | 174/394 |
| 2011/0049437 A1* | 3/2011 | Crain | C09D 7/70 |
| | | | 977/734 |
| 2011/0236710 A1 | 9/2011 | Lee et al. | |
| 2012/0121891 A1 | 5/2012 | Kim et al. | |
| 2013/0240261 A1 | 9/2013 | Song et al. | |
| 2015/0041730 A1 | 2/2015 | Kangas et al. | |
| 2016/0362565 A1 | 12/2016 | Fornes et al. | |
| 2017/0206997 A1* | 7/2017 | Al-Harthi | C08J 5/18 |
| 2017/0253750 A1 | 9/2017 | Okada et al. | |
| 2018/0218802 A1 | 8/2018 | Alden et al. | |
| 2019/0185632 A1* | 6/2019 | Christy | C08G 16/0231 |
| 2019/0256356 A1 | 8/2019 | Hou et al. | |
| 2020/0163261 A1 | 5/2020 | Choi et al. | |
| 2020/0276797 A1 | 9/2020 | Zdrojek et al. | |
| 2021/0253429 A1 | 8/2021 | Iftime et al. | |
| 2023/0413500 A1 | 12/2023 | El-Kady et al. | |

FOREIGN PATENT DOCUMENTS

| | | |
|---|---|---|
| CN | 108668517 A | 10/2018 |
| CN | 109563285 A | 4/2019 |
| CN | 109608676 A | 4/2019 |
| CN | 109666350 A | 4/2019 |
| EP | 3536743 A1 | 9/2019 |
| JP | 2011510905 A | 4/2011 |
| JP | 2016169149 A | 9/2016 |
| JP | 2020143225 A | 9/2020 |
| WO | WO-2009123771 A2 | 10/2009 |
| WO | WO-2011163129 A2 | 12/2011 |
| WO | WO-2021138598 A1 | 7/2021 |
| WO | WO-2022115617 A1 | 6/2022 |

OTHER PUBLICATIONS

PCT/US2020/067727 International Invitation to Pay Additional Fees dated Mar. 9, 2021.
PCT/US2020/067727 International Preliminary Report on Patentability dated Jul. 14, 2022.
PCT/US2020/067727 International Search Report and Written Opinion dated May 5, 2021.
PCT/US2021/060839 International Search Report and Written Opinion dated Feb. 14, 2022.
U.S. Appl. No. 17/139,804 Final Office Action dated Dec. 4, 2021.
U.S. Appl. No. 17/139,804 Office Action dated Aug. 24, 2021.
U.S. Appl. No. 17/139,804 Ex-Parte Quayle action dated Jun. 13, 2022.
U.S. Appl. No. 17/139,804 Restriction Requirement dated Jun. 7, 2021.
Yang et al.: Chapter 12-Carbon nanotubes: Surface, porosity, and related applications. Carbon Nanotechnology: Recent Developments in Chemistry, Physics, Materials Science and Device Applications [Publisher summary only] pp. 323-359 DOI:10.1016/B978-044451855-2/50015-2 (2006).
Chinese Application No. CN2020080098023.4 Office Action dated Feb. 2, 2023.
EP20210899124.8 Extended European Search Report dated Sep. 27, 2024.
EP20910585.7 European Search Report dated Jan. 2, 2024.
Japanese Patent Application No. 2022-540593 Office Action mailed on Dec. 19, 2024.

* cited by examiner

| Sample | Graphite % | C % | GO/rGO | GO/rGO % | CNT Type | CNT % | Binder | Binder % | solid content % | Solvent | Substrate | Wet T(um) | Dry T(um) | Sheet Resistance ohm/sq | Conductivity (S/m) |
|---|---|---|---|---|---|---|---|---|---|---|---|---|---|---|---|
| 6 | - | - | rGO | 5-15 | - | - | PVDF | 85-95 | 4-6 | NMP | Glass | - | 4 | - | - |
| 7 | - | - | rGO | 10-20 | - | - | PVDF | 80-90 | 5-8 | NMP | Glass | - | 4 | - | 2 |
| 8 | - | - | rGO | 20-35 | - | - | PVDF | 65-75 | 5-8 | NMP | Glass | - | 7 | - | 0 |
| 9 | - | - | rGO | 40-50 | - | - | PVDF | 50-60 | 6-10 | NMP | Glass | - | 10 | - | 36 |
| 10 | - | - | GO | 100 | - | - | - | - | - | water | PET | - | 3-4 | - | - |
| 11 | - | - | GO | 100 | - | - | - | - | - | water | PET | - | 2-3 | - | - |
| 12 | 90-100 | 2-6 | GO | - | - | - | CMC/SBR | 2-4 | 50-60 | water | PET | 1,000 | 830 | 2 | 700 |
| 13 | 90-100 | 2-6 | GO | - | - | - | CMC/SBR | 2-4 | 50-60 | water | PET | 1,000 | 830 | 2 | 700 |
| 14 | 85-95 | 1-5 | - | - | CNT OH | 0.5-1.5 | CMC/SBR | 2.5-5 | 50-60 | water | PET | 1,000 | 830 | 2 | 480 |
| 15 | 85-95 | 1-5 | - | - | CNT OH | 1-3 | CMC/SBR | 2.5-5 | 50-60 | water | PET | 1,000 | 900 | 2 | 700 |
| 16 | 85-95 | 1-5 | rGO | 1-3 | - | - | CMC/SBR | 2.5-5 | 50-60 | water | PET | 1,000 | 1,100 | 2 | 600 |
| 17 | 80-90 | 1-5 | rGO | 1-3 | CNT OH | 0.5-1.5 | CMC/SBR | 2.5-5 | 50-60 | water | PET | 1,000 | 1,050 | 2 | 660 |
| 18 | 90-100 | - | - | - | - | - | PVDF | 3-8 | 45-55 | NMP | Glass | 1,000 | 440 | 4 | 700 |
| 19 | - | - | rGO | 5-15 | CNT | 5-15 | PVDF | 75-85 | - | NMP | PET | 200 | 9 | - | 14-16 |
| 20 | - | - | - | - | CNT OH | 5-15 | PVDF | 65-75 | 5-8 | NMP | - | - | 100 | 29 | 330 |
| 21 | - | - | - | - | CNT OH | 5-15 | PVDF | 65-72 | 5-8 | NMP | - | - | 200 | 29 | 330 |
| 22 | - | - | rGO | 5-10 | CNT OH | 5-10 | PVDF | 80-90 | 5-15 | NMP | Glass | 1,500 | 90 | 1,000 | 11 |
| 23 | - | - | rGO | 15-25 | CNT OH | 10-20 | PVDF | 60-70 | 5-15 | NMP | Glass | 1,500 | 148 | 32 | 210 |
| 24 | 85-95 | 1-4 | rGO | 2-5 | CNT OH | 1-3 | CMC/SBR | 2-5 | 45-55 | Water | Cu | 500 | 232 | 0 | 74,294 |
| 25 | | | rGO | 2-5 | | | | | | | PET | 500 | 187 | 4 | 1,233 |
| 26 | 85-95 | 1-4 | rGO | 2-5 | - | - | CMC/SBR | 2-5 | 45-55 | Water | Cu | 500 | 381 | 0 | 6,336 |
| 27 | | | rGO | 2-5 | | | | | | | PET | 500 | 291 | 3 | 1,110 |
| 28 | 85-95 | 1-4 | rGO | 2-5 | CNT OH | 1-3 | CMC/SBR | 2-5 | 45-55 | Water | Cu | 500 | 350 | 0 | 11,040 |
| 29 | | | rGO | 2-5 | | | | | | | PET | 500 | 262 | 6 | 615 |
| 30 | 85-95 | | rGO | 2-5 | CNT OH | 2-5 | CMC/SBR | 2-5 | 45-55 | Water | PET | 500 | 227 | 3 | 1,583 |
| 31 | | 1-4 | rGO | 2-5 | | | | | | | Cu | 500 | 360 | 0 | 11,589 |
| 32 | 100 | | - | - | - | - | CMC/SBR | 3-6 | 50-60 | Water | Cu | 500 | 381 | 0 | 6,336 |
| 33 | 0 | | - | - | - | - | - | - | - | - | Cu | - | - | - | - |

FIG. 7

ELECTROMAGNETIC INTERFERENCE SHIELDING MATERIALS, DEVICES, AND METHODS OF MANUFACTURE THEREOF

CROSS-REFERENCE

This application claims the benefit of U.S. Provisional Application No. 62/957,030, filed Jan. 3, 2020, and U.S. Provisional Application No. 62/957,035, filed Jan. 3, 2020, which are hereby incorporated by reference in their entirety herein.

BACKGROUND

Electromagnetic interference (EMI) is a signal received from a natural or man-made external source that is unwanted. Such EMI can and negatively affect the performance of electrical component through electromagnetic induction, electrostatic coupling, or conduction provided thereby. These electronic disturbances can degrade the performance of computing and communication components by increasing the error rates in data transfer and storage. EMI shielding, however, can protect electrical devices from external signal interference, from leaking EMI signals, and to prevent electrical components within an electrical device from interfering with each other. Shielding from EMI is also important to ensure accurate testing and calibration of electronic components.

EMI shields are typically composed of metals or metal composites, due to their high conductivity. However, such metallic components can be difficult to manufacture and are susceptible to chemical corrosions and oxidations, which reduce the shielding effectiveness over time.

SUMMARY

Disclosed herein are electromagnetic shields or shielding materials that provide numerous advantages over conventional EMI shields. The EMI shields can be used to efficiently dissipate heat and minimize problems associated with EMI interference via its superior electrical and/or thermal properties while also providing excellent mechanical flexibility and structural integrity. Unlike conventional metal foils, the EMI shielding materials disclosed herein are mechanically strong, corrosion resistant and offer processing advantages. In addition to high thermal and electrical conductivity, the EMI shielding materials can be thin, flexible, lightweight, and corrosion resistant. It can also be easy to cut and able to withstand repeated bending in contrast to standard metal-based EMI shielding that are more difficult to cut and can be subject to metal fatigue if subjected to repeated bending.

Disclosed herein are methods of manufacturing EMI shields or shielding materials. Compared to conventional EMI shields, the EMI shielding materials of the present disclosure are easier to manufacture and can be prepared at various thicknesses and sizes on different substrates to achieve the desired combination of properties. For example, a thicker and less flexible material may be prepared to allow greater EMI reduction for more sensitive electronics where flexibility is of less importance.

In some embodiments, the EMI shields or shielding materials are configured to be water resistant and/or waterproof. In some embodiments, the EMI shields or shielding materials are configured to have structural flexibility and/or resilience. In some embodiments, the EMI shields or shielding materials are configured to be scratch resistant. For example, in some embodiments, the EMI shields or shielding materials comprise binders or binder compositions such as carboxylated styrene acrylic latex and/or acrylic.

In one aspect, disclosed herein is an electromagnetic shield comprising: a substrate; a conductive additive; and a binder incorporated with the conductive additive and deposited on the substrate. In some embodiments, the substrate comprises a plastic, a metal, a glass, a fabric, or any combination thereof. In some embodiments, the metal comprises copper, aluminum, steel, stainless steel, beryllium, bismuth, chromium, cobalt, gallium, gold, indium, iron, lead, magnesium, nickel, silver, titanium, tin, zinc, or any combination thereof. In some embodiments, the plastic comprises a thermoplastic. In some embodiments, the thermoplastic comprises polyethylene terephthalate, polyglycolic acid, polylactic acid, polycaprolactone, polyhydroxyalkanoate, polyhydroxybutyrate, polyethylene adipate, polybutylene succinate, poly(3-hydroxybutyrate-co-3-hydroxyvalerate), polybutylene terephthalate, polytrimethylene terephthalate, polyethylene naphthalate, or any combination thereof. In some embodiments, the conductive additive comprises a carbon-based additive. In some embodiments, the carbon-based additive comprises, graphite, graphene, reduced graphene, graphene oxide, reduced graphene oxide, carbon black, cabot carbon, a carbon nanotube, a functionalized carbon nanotube, or any combination thereof. In some embodiments, the carbon-based additive is reduced. In some embodiments, the carbon-based additive is porous. In some embodiments, the carbon-based additive comprises nanoplatelets, nanofibers, nanotubes, nanoparticles, nanorods, nanowires, nanoflowers, nanoflakes, nanofibers, nanoplatelets, nanoribbons, nanocubes, bipyramids, nanodiscs, nanoplates, nanodendrites, nanoleaves, nanospheres, quantum spheres, quantum dots, nanosprings, nanosheets, or any combination thereof. In some embodiments, the carbon nanotube is a multi-walled nanotube, a single-walled nanotube, or a combination thereof. In some embodiments, the functionalized carbon nanotube is functionalized with hydroxide, carboxylic acid, or both. In some embodiments, the carbon nanotube has an outside diameter of about 20 nm to about 60 nm. In some embodiments, the carbon nanotube has a length of about 0.25 μm to about 4 μm. In some embodiments, the carbon nanotube has a specific surface area of greater than about 60 m2/g In some embodiments, the carbon nanotube has an electrical conductivity of greater than about 100 S/cm. In some embodiments, the carbon-based additive has a mean particle size of about 2 μm to about 30 μm. In some embodiments, the carbon-based additive has a specific surface area of about 2 $m^2/g$ to about 16 $m^2/g$. In some embodiments, the carbon-based additive has a density of 0.5 $g/cm^3$ to about 4 $g/cm^3$. In some embodiments, at least one of the graphene and the graphene oxide has a specific surface area of greater than 1,000 $m^2/g$. In some embodiments, at least one of the graphene and the graphene oxide has a conductivity of about 1,000 S/m to about 4,000 S/m. In some embodiments, the reduced graphene oxide comprises reduced graphene oxide sheets having a width, length or both of about 0.3 μm to about 10 μm. In some embodiments, the binder comprises a polymeric binder. In some embodiments, the polymeric binder comprises styrene butadiene rubber, polyvinylidene fluoride, polytetrafluoroethylene, polyvinyl pyrrolidone, ethyl cellulose, polyurethane, polyester, carboxymethyl cellulose, polyurethane, polyester, polyvinyl alcohol, or any combination thereof. In some embodiments, the electromagnetic shield comprises about 2.5% to about 99% by weight of the conductive additive. In some embodiments, the electromagnetic shield has a conductivity of about 10 S/m to about 20,000 S/m. In some embodiments, the electromagnetic shield has a sheet resistance of about 0.1 ohm/sq to about 1,000 ohm/sq. In some embodiments, the electromagnetic shield has an operating temperature of at about 0° C. to about 400° C. In some embodiments, the electromagnetic shield has a thickness of about 10 µm to about 1,000 µm. In some embodiments, the electromagnetic shield has a shielding effectiveness in the frequency range of about 10 kHz to about 40 MHz of about 20 dB to about 40 dB with a film thickness of less than about 100 µm. In some embodiments, the electromagnetic shield has a shielding effectiveness in the frequency range of 1 GHz to 40 GHz of about 40 dB to about 70 dB with a film thickness of less than about 100 µm. In some embodiments, the electromagnetic shield has a shielding effectiveness in the frequency range of about 10 kHz to about 30 kHz of about 5 dB to about 40 dB. In some embodiments, the electromagnetic shield has a shielding effectiveness in the frequency range of about 40 kHz to about 100 MHz of about 1 dB to about 100 dB. In some embodiments, the electromagnetic shield has a shielding effectiveness in the frequency range of about 200 MHz to about 1 GHz of about 1 dB to about 100 dB. In some embodiments, the electromagnetic shield has a shielding effectiveness in the frequency range of about 2 GHz to about 18 GHz of about 1 dB to about 120 dB. In some embodiments, the electromagnetic shield has a shielding effectiveness in the frequency range of about 18 GHz to about 40 GHz of about 1 dB to about 120 dB.

Another aspect provided herein is a method of forming an electromagnetic shield, comprising: forming a coating comprising: a conductive additive; a binder; a solvent; a surfactant; and a defoamer; depositing the coating on a substrate; and drying the coating on the substrate. In some embodiments, the conductive additive comprises a carbon-based additive. In some embodiments, the carbon-based additive comprises, graphite, graphene, reduced graphene, graphene oxide, reduced graphene oxide, carbon black, cabot carbon, a carbon nanotube, a functionalized carbon nanotube, or any combination thereof. In some embodiments, the carbon-based additive is reduced. In some embodiments, the carbon-based additive is porous. In some embodiments, the carbon-based additive comprises nanoplatelets, nanofibers, nanotubes, nanoparticles, nanorods, nanowires, nanoflowers, nanoflakes, nanofibers, nanoplatelets, nanoribbons, nanocubes, bipyramids, nanodiscs, nanoplates, nanodendrites, nanoleaves, nanospheres, quantum spheres, quantum dots, nanosprings, nanosheets, or any combination thereof. In some embodiments, the carbon nanotube is a multi-walled nanotube, a single-walled nanotube, or a combination thereof. In some embodiments, the functionalized carbon nanotube is functionalized with hydroxide, carboxylic acid, or both. In some embodiments, the carbon nanotube has an outside diameter of about 20 nm to about 60 nm. In some embodiments, the carbon nanotube has a length of about 0.25 µm to about 4 µm. In some embodiments, the carbon nanotube has a specific surface area of greater than about 60 $m^2/g$ In some embodiments, the carbon nanotube has an electrical conductivity of greater than about 100 S/cm. In some embodiments, the carbon-based additive has a mean particle size of about 2 µm to about 30 µm. In some embodiments, the carbon-based additive has a specific surface area of about 2 $m^2/g$ to about 16 $m^2/g$. In some embodiments, the carbon-based additive has a density of 0.5 $g/cm^3$ to about 4 $g/cm^3$. In some embodiments, at least one of the graphene and the graphene oxide has a specific surface area of greater than 1,000 $m^2/g$. In some embodiments, at least one of the graphene and the graphene oxide has a conductivity of about 1,000 S/m to about 4,000 S/m. In some embodiments, the reduced graphene oxide comprises reduced graphene oxide sheets having a width, length or both of about 0.3 µm to about 10 µm. In some embodiments, the binder comprises a polymeric binder. In some embodiments, the polymeric binder comprises styrene butadiene rubber, polyvinylidene fluoride, polytetrafluoroethylene, polyvinyl pyrrolidone, ethyl cellulose, polyurethane, polyester, or any combination thereof. In some embodiments, the solvent comprises a polar aprotic solvent, or a polar protic solvent. In some embodiments, the polar aprotic solvent comprises N-Methyl-2-pyrrolidone, or dichloromethane, tetrahydrofuran, ethyl acetate, acetone, dimethylformamide, acetonitrile, dimethyl sulfoxide, propylene carbonate, or any combination thereof. In some embodiments, the polar protic solvent comprises water, formic acid, n-butanol, isopropanol, nitromethane, ethanol, methanol, acetic acid, or any combination thereof. In some embodiments, the surfactant comprises an acid, a nonionic surfactant, or any combination thereof. In some embodiments, the acid comprises perfluorooctanoic acid, perfluorooctane sulfonate, perfluorohexane sulfonic acid, perfluorononanoic acid, perfluorodecanoic acid, or any combination thereof. In some embodiments, the nonionic surfactant comprises polyethylene glycol alkyl ether, octaethylene glycol monododecyl ether, pentaethylene glycol monododecyl ether, polypropylene glycol alkyl ether, glucoside alkyl ether, decyl glucoside, lauryl glucoside, octyl glucoside, polyethylene glycol octylphenyl ether, dodecyldimethylamine oxide, polyethylene glycol alkylphenyl ether, polyethylene glycol octylphenyl ether, Triton X-100 (CAS 9002-93-1), polyethylene glycol alkylphenyl ether, nonoxynol-9, glycerol alkyl ester polysorbate, sorbitan alkyl ester, polyethoxylated tallow amine, Dynol 604, Zonyl F5-300 (CAS 197664-69-0), or any combination thereof. In some embodiments, the defoamer comprises an insoluble oil, a silicone, a glycol, a stearate, an organic solvent, Surfynol DF-1100, alkyl polyacrylate, or any combination thereof. In some embodiments, the insoluble oil comprises mineral oil, vegetable oil, white oil, or any combination thereof. In some embodiments, the silicone comprises polydimethylsiloxane, silicone glycol, a fluorosilicone, or any combination thereof. In some embodiments, the glycol comprises polyethylene glycol, ethylene glycol, propylene glycol, or any combination thereof. In some embodiments, the stearate comprises glycol stearate, stearin, or any combination thereof. In some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof. In some embodiments, the viscosity modifier comprises N-methyl-2-pyrrolidone, ethanol, isopropyl alcohol, cyclohexanone, terpineol 3-methoxy-3-methyl-1-butanol, 4-hydroxyl-4-methyl-pentane-2-one, methyl isobutyl ketone, or any combination thereof. In some embodiments, the coating comprises about 2% to about 99% by weight of the conductive additive. In some embodiments, the coating comprises about 2% to about 90% by weight of the binder. In some embodiments, the coating comprises about 40% to about 90% by weight of the solvent. In some embodiments, the coating comprises about 0.01% to about 10% by weight of the surfactant. In some embodiments, the coating comprises about 0.1% to about 5% by weight of the defoamer. In some embodiments, the substrate comprises a plastic, a metal, a glass, a fabric, or any combination thereof. In some embodiments, the metal comprises copper, aluminum, steel, stainless steel, or any combination thereof. In some embodiments, the plastic comprises a thermoplastic. In some embodiments, the thermoplastic comprises polyethylene terephthalate, polyglycolic acid, polylactic acid, polycaprolactone, polyhydroxyalkanoate, polyhydroxybutyrate, polyethylene adipate, polybutylene succinate, poly(3-hydroxybutyrate-co-3-hydroxyvalerate), polybutylene terephthalate, polytrimethylene terephthalate, polyethylene naphthalate, or any combination thereof. In some embodiments, a set thickness of the coating is deposited on the substrate. In some embodiments, drying the coating on the substrate comprises drying at a temperature of about 20° C. to about 120° C. In some embodiments, forming the coating comprises: mixing the coating; breaking down agglomerates in the coating; removing air bubbles from the coating; or any combination thereof. In some embodiments, the mixing is performed by an acoustic mixer, a planetary mixer, a powder mixer, or any combination thereof. In some embodiments, the breaking down of the agglomerates in the coating is performed by a high shear mixer. In some embodiments, the removing of the air bubbles from the coating is performed by a vacuum mixer. In some embodiments, depositing the coating on a substrate comprises depositing the coating on the substrate with a coating machine, a doctor's blade, a table-top coater, an air sprayer, or any combination thereof. In some embodiments, the coating machine is a slot die coating machine. In some embodiments, at least one of the breaking down of the agglomerates in the coating and the removing of the air bubbles from the coating is performed until the coating has a viscosity of about 1,000 mPa/s to about 5,000 mPa/s. In some embodiments, the coating has a viscosity of about 1,000 mPa/s to about 5,000 mPa/s. In some embodiments, the method further comprises calendaring the electromagnetic shield. In some embodiments, calendaring is performed by a roll to roll calendaring machine. In some embodiments, the electromagnetic shield has a conductivity of about 10 S/m to about 20,000 S/m. In some embodiments, the electromagnetic shield has a sheet resistance of about 0.1 ohm/sq to about 1,000 ohm/sq. In some embodiments, the electromagnetic shield has an operating temperature of at about 0° C. to about 400° C. In some embodiments, the electromagnetic shield has a thickness of about 10 µm to about 2,000 µm. In some embodiments, the electromagnetic shield has a shielding effectiveness in the frequency range of about 10 kHz to about 40 MHz of about 20 dB to about 40 dB with a film thickness of less than about 100 µm. In some embodiments, the electromagnetic shield has a shielding effectiveness in the frequency range of 1 GHz to 40 GHz of about 40 dB to about 120 dB with a film thickness of less than about 100 µm. In some embodiments, the electromagnetic shield has a shielding effectiveness in the frequency range of about 10 kHz to about 30 kHz of about 5 dB to about 40 dB. In some embodiments, the electromagnetic shield has a shielding effectiveness in the frequency range of about 40 kHz to about 100 MHz of about 1 dB to about 100 dB. In some embodiments, the electromagnetic shield has a shielding effectiveness in the frequency range of about 200 MHz to about 1 GHz of about 1 dB to about 100 dB. In some embodiments, the electromagnetic shield has a shielding effectiveness in the frequency range of about 2 GHz to about 18 GHz of about 1 dB to about 120 dB. In some embodiments, the electromagnetic shield has a shielding effectiveness in the frequency range of about 18 GHz to about 40 GHz of about 1 dB to about 120 dB. Another aspect provided herein is a method of forming an electromagnetic shield, comprising: obtaining a coating composition comprising: a conductive additive; a binder; a solvent; a surfactant; and a defoamer; depositing the coating composition on a substrate; and drying the coating on the substrate.

BRIEF DESCRIPTION OF THE DRAWINGS

The novel features of the disclosure are set forth with particularity in the appended claims. A better understanding of the features and advantages of the present disclosure will be obtained by reference to the following detailed description that sets forth illustrative embodiments, in which the principles of the disclosure are utilized, and the accompanying drawings of which:

FIG. 7 shows a table listing examples of EMI shielding samples;

DETAILED DESCRIPTION

Current EMI shielding materials employ metals or metal composites for their high conductivity, however such materials can be difficult to process and are susceptible to chemical corrosions and oxidations, resulting in reduced shielding effectiveness over time.

Provided herein are carbon-based electromagnetic interference shielding devices and shielding materials, and preparation methods thereof. The EMI shields and shield coatings herein prevent or reduce RF signals and waves from passing therethrough. In some embodiments, the EMI shielding devices are formed by a coating deposited on a substrate. In some embodiments, the EMI shielding devices are formed with compression molding techniques. The EMI shielding devices can be shaped from one or more sheets. The sheets can be thin, flexible, lightweight, and/or corrosion resistant. The EMI shielding materials can be adapted to provide EMI shielding or filtering according to the desired effect. As an example, an EMI shield can be shaped as an enclosure (e.g., a box shape enclosing sensitive electronics). As another example, EMI shielding materials can be cut into thin, flexible sheets sized to the walls of a room, and then applied to the walls, optionally with an adhesive on one side of the sheets, in order to generate an EMI shielded room. Accordingly, the various advantages of the present disclosure include allowing EMI shielding to be efficiently adapted to devices, rooms, vehicles, or other relevant implementations, even when such implementations were not designed for or even originally contemplate EMI shielding.

EMI Shielding Mechanics

Figure 1:
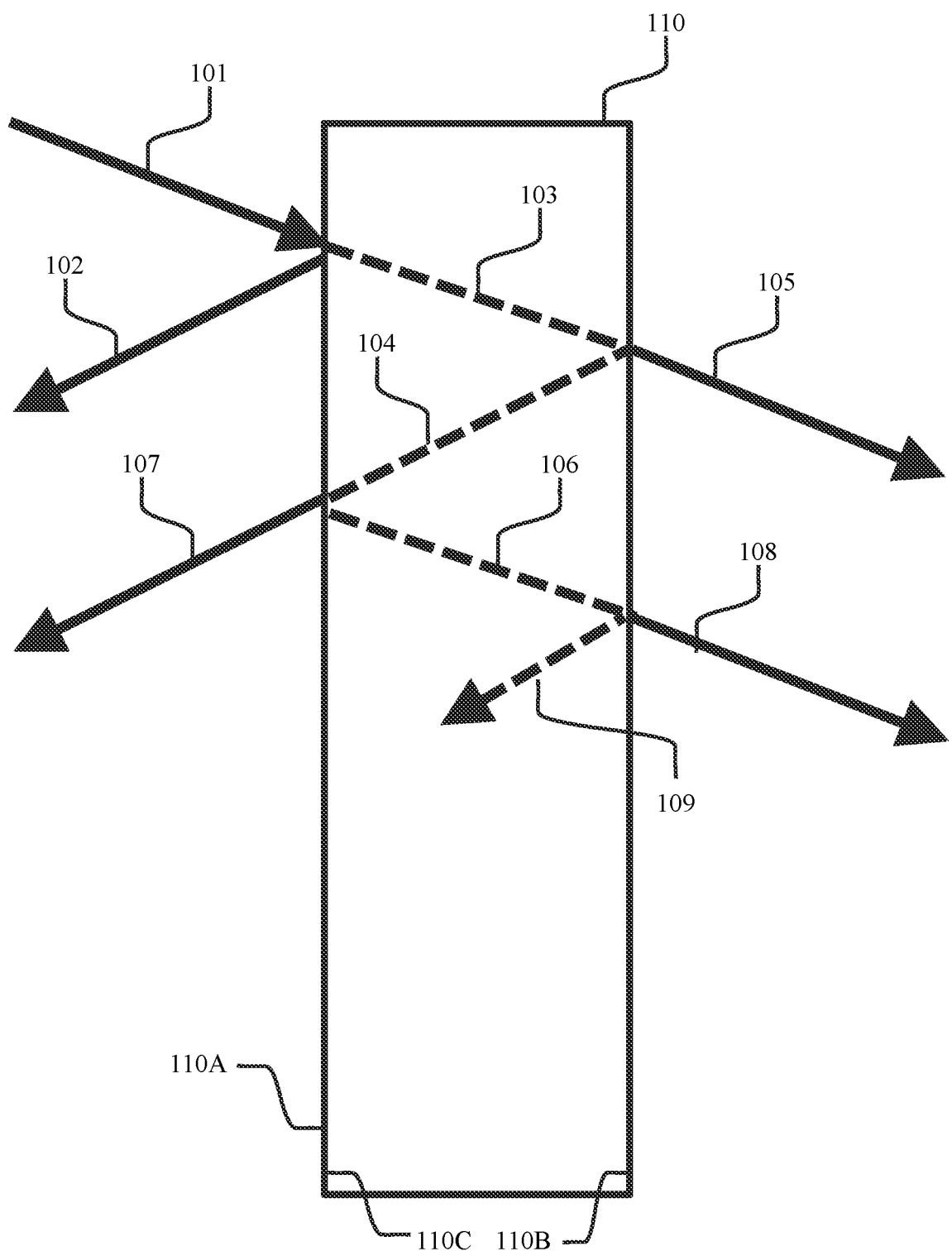
FIG. 1 is a diagram of the reflection and absorption in an Electromagnetic Interference (EMI) shield.

FIG. 1 shows a diagram of the reflection and absorption in an Electromagnetic Interference (EMI) shield 110. As shown therein, a first externally reflected portion 102 (e.g., a d-wave reflectance) of an incident t-wave 101 is reflected by an outer proximal surface 110A of the EMI shield, whereas an absorbed portion 103 of the t-wave 101 is absorbed into the EMI shield 110. A first internally reflected portion 104 of the absorbed portion 103 reflects off an interior distal surface 110B of the EMI shield 110 wherein a first attenuated portion 105 of the first absorbed portion 103 is transmitted distally through the EMI shield 110. Thereafter, a second internally reflected portion 106 of the first internally reflected portion 104 reflects off an interior proximal surface 110C of the EMI shield 110 wherein a second externally reflected portion 107 of the first internally reflected portion 104 is transmitted proximally towards the source of the incident t-wave 101 and parallel to the first externally reflected portion 102. The internal reflection continues as a third internally reflected portion 109 of the second internally reflected portion 106 reflects off an interior distal surface 110B of the EMI shield 110 wherein a second attenuated portion 108 of the second internally reflected portion 106 is transmitted distally into the EMI shield 110.

In some embodiments, the effectiveness of the EMI 110 shield correlates to a ratio between a strength the incident t-wave 101 and the sum of the strengths of the first attenuated portion 105 and the second attenuated portion 108. In some embodiments, the effectiveness of the EMI 110 shield correlates to a ratio between the sum of the strengths of the first externally reflected portion 102 and the second externally reflected portion 107 and the sum of the strengths of the first attenuated portion 105 and the second attenuated portion 108. In some embodiments, the effectiveness of the EMI 110 shield correlates to a ratio between the sum of the strengths of the first externally reflected portion 102 and the second externally reflected portion 107 and the strength of the incident t-wave 101.

EMI Shields

Provided herein is an electromagnetic shield comprising: a substrate; a conductive additive; and a binder incorporated with the conductive additive and deposited on the substrate. In some embodiments, the conductive additive and the binder are mixed together to form a coating. In some embodiments, the conductive additive and the binder form a carbon-polymer nanocomposite. In some embodiments, the conductive additive and the binder form a physically robust and chemically resistant matrix with a high electrical conductivity. In some embodiments, the conductive additive acts as a physical/mechanical enhancer for the binder matrix, enabling improved hardness, tensile strength, and flexibility. In some embodiments, the EMI shields or shielding materials are configured to be water resistant and/or waterproof. In some embodiments, the EMI shields or shielding materials are configured to have structural flexibility and/or resilience. In some embodiments, the EMI shields or shielding materials are configured to be scratch resistant. For example, in some embodiments, the EMI shields or shielding materials comprise binders or binder compositions such as carboxylated styrene acrylic latex (e.g., Trinseo 9501) and/or acrylic (e.g., Rustoleum 710). In some embodiments, the carboxylated styrene acrylic latex composition is present in the EMI shield or slurry/composition for forming the EMI shield at a dry weight (w/w) percentage (i.e., dry mass only). In some embodiments, the electromagnetic shield comprises a percentage by weight of the binder or binder composition (e.g., carboxylated styrene acrylic latex and/or acrylic) of about 5% to about 50%. In some embodiments, the electromagnetic shield comprises a percentage by weight of the binder or binder composition of about 5% to about 10%, about 5% to about 20%, about 5% to about 30%, about 5% to about 40%, about 5% to about 50%, about 10% to about 20%, about 10% to about 30%, about 10% to about 40%, about 10% to about 50%, about 20% to about 30%, about 20% to about 40%, about 20% to about 50%, about 30% to about 40%, about 30% to about 50%, or about 40% to about 50%. In some embodiments, the electromagnetic shield comprises a percentage by weight of the binder or binder composition of about 5%, about 10%, about 20%, about 30%, about 40%, or about 50%. In some embodiments, the electromagnetic shield comprises a percentage by weight of the binder or binder composition of at least about 5%, about 10%, about 20%, about 30%, or about 40%. In some embodiments, the electromagnetic shield comprises a percentage by weight of the binder or binder composition of at most about 10%, about 20%, about 30%, about 40%, or about 50%. In some embodiments, the electromagnetic shield comprises between about 10% to about 20% of the carboxylated styrene acrylic latex. In some embodiments, the electromagnetic shield comprises between about 20% to about 30% of the acrylic.

Figure 14:
FIG. 14 shows an image displaying the flexibility of an exemplary filtering sample.

In some embodiments, the electromagnetic shield comprises a stack of a plurality of electromagnetic shields. In some embodiments, the electromagnetic shield further comprises a scratch resistant coating, an impact resistant coating, or any combination thereof. In some embodiments, the electromagnetic shield is flexible. FIG. 14 shows an image displaying the flexibility of an exemplary filtering sample. In some embodiments, the electromagnetic shield is rigid. In some embodiments, the electromagnetic shield is flat. In some embodiments, the electromagnetic shield is curved. In some embodiments, the electromagnetic shield is formed into a single surface. In some embodiments, the electromagnetic shield is formed into a plurality of surfaces.

In some embodiments, the substrate comprises a plastic, a metal, a glass, a fabric, or any combination thereof. In some embodiments, the metal comprises copper, aluminum, steel, stainless steel, beryllium, bismuth, chromium, cobalt, gallium, gold, indium, iron, lead, magnesium, nickel, silver, titanium, tin, zinc, or any combination thereof. In some embodiments, the plastic comprises a thermoplastic. In some embodiments, the thermoplastic comprises polyethylene terephthalate, polyglycolic acid, polylactic acid, polycaprolactone, polyhydroxyalkanoate, polyhydroxybutyrate, polyethylene adipate, polybutylene succinate, poly(3-hydroxybutyrate-co-3-hydroxyvalerate), polybutylene terephthalate, polytrimethylene terephthalate, polyethylene naphthalate, or any combination thereof. In some embodiments, the electromagnetic shield does not comprise a substrate. In some embodiments, the substrate is planar. In some embodiments, the substrate is curved. In some embodiments, the substrate is rigid. In some embodiments, the substrate is flexible. In some embodiments, the substrate comprises a single surface. In some embodiments, the substrate comprises two or more surfaces. In some embodiments, the substrate is a container for an electrical device. In some embodiments, the substrate is flat. In some embodiments, the substrate is curved. In some embodiments, the substrate comprises two or more surfaces. In some embodiments, the conductive additives, binders, or both herein enable the use of a plastic substrate.

In some embodiments, the binder comprises a polymeric binder. In some embodiments, the polymeric binder comprises styrene butadiene rubber, polyvinylidene fluoride, polytetrafluoroethylene, polyvinyl pyrrolidone, ethyl cellulose, polyurethane, polyester, carboxymethyl cellulose, polyurethane, polyester, polyvinyl alcohol, or any combination thereof. In some embodiments, the binder forms a robust yet flexible matrix for the composite materials mixed therewith. In some embodiments, the binder adheres the active materials and conductive agents together and onto the substrate. In some embodiments, the specific binders herein enable the use a variety of different substrates. In some embodiments, the polymer binder forms a robust yet flexible matrix for the composite materials.

In some embodiments, the conductive additive comprises a carbon-based additive. In some embodiments, the carbon-based additive comprises, graphite, graphene, reduced graphene, graphene oxide, reduced graphene oxide, carbon black, cabot carbon, a carbon nanotube, a functionalized carbon nanotube, or any combination thereof. In some embodiments, the carbon-based additive is reduced. In some embodiments, the carbon-based additive is porous. In some embodiments, the carbon-based additive comprises nanoplatelets, nanofibers, nanotubes, nanoparticles, nanorods, nanowires, nanoflowers, nanoflakes, nanofibers, nanoplatelets, nanoribbons, nanocubes, bipyramids, nanodiscs, nanoplates, nanodendrites, nanoleaves, nanospheres, quantum spheres, quantum dots, nanosprings, nanosheets, or any combination thereof. In some embodiments, the carbon nanotube is a multi-walled nanotube, a single-walled nanotube, or a combination thereof. In some embodiments, the conductive additive is functionalized. In some embodiments, the conductive additive is functionalized with an oxygen containing group. In some embodiments, the functionalized carbon nanotube is functionalized with hydroxide, carboxylic acid, or both. In some embodiments, the conductive additive has a high electrical conductivity. In some embodiments, the conductive additive uniformly blends with various polymers and resins in a wet coating or dry powder.

In some embodiments, the electromagnetic shield comprises a percentage by weight of the conductive additive of about 2.5% to about 99%. In some embodiments, the electromagnetic shield comprises a percentage by weight of the conductive additive of about 2.5% to about 5%, about 2.5% to about 10%, about 2.5% to about 15%, about 2.5% to about 20%, about 2.5% to about 30%, about 2.5% to about 40%, about 2.5% to about 50%, about 2.5% to about 60%, about 2.5% to about 70%, about 2.5% to about 80%, about 2.5% to about 99%, about 5% to about 10%, about 5% to about 15%, about 5% to about 20%, about 5% to about 30%, about 5% to about 40%, about 5% to about 50%, about 5% to about 60%, about 5% to about 70%, about 5% to about 80%, about 5% to about 99%, about 10% to about 15%, about 10% to about 20%, about 10% to about 30%, about 10% to about 40%, about 10% to about 50%, about 10% to about 60%, about 10% to about 70%, about 10% to about 80%, about 10% to about 99%, about 15% to about 20%, about 15% to about 30%, about 15% to about 40%, about 15% to about 50%, about 15% to about 60%, about 15% to about 70%, about 15% to about 80%, about 15% to about 99%, about 20% to about 30%, about 20% to about 40%, about 20% to about 50%, about 20% to about 60%, about 20% to about 70%, about 20% to about 80%, about 20% to about 99%, about 30% to about 40%, about 30% to about 50%, about 30% to about 60%, about 30% to about 70%, about 30% to about 80%, about 30% to about 99%, about 40% to about 50%, about 40% to about 60%, about 40% to about 70%, about 40% to about 80%, about 40% to about 99%, about 50% to about 60%, about 50% to about 70%, about 50% to about 80%, about 50% to about 99%, about 60% to about 70%, about 60% to about 80%, about 60% to about 99%, about 70% to about 80%, about 70% to about 99%, or about 80% to about 99%. In some embodiments, the electromagnetic shield comprises a percentage by weight of the conductive additive of about 2.5%, about 5%, about 10%, about 15%, about 20%, about 30%, about 40%, about 50%, about 60%, about 70%, about 80%, or about 99%. In some embodiments, the electromagnetic shield comprises a percentage by weight of the conductive additive of at least about 2.5%, about 5%, about 10%, about 15%, about 20%, about 30%, about 40%, about 50%, about 60%, about 70%, or about 80%. In some embodiments, the electromagnetic shield comprises a percentage by weight of the conductive additive of at most about 5%, about 10%, about 15%, about 20%, about 30%, about 40%, about 50%, about 60%, about 70%, about 80%, or about 99%.

In some embodiments, the carbon-based additive has a specific surface area of about 2 $m^2/g$ to about 16 $m^2/g$. In some embodiments, the carbon-based additive has a specific surface area of about 2 $m^2/g$ to about 4 $m^2/g$, about 2 $m^2/g$ to about 6 $m^2/g$, about 2 $m^2/g$ to about 8 $m^2/g$, about 2 $m^2/g$ to about 10 $m^2/g$, about 2 $m^2/g$ to about 12 $m^2/g$, about 2 $m^2/g$ to about 14 $m^2/g$, about 2 $m^2/g$ to about 16 $m^2/g$, about 4 $m^2/g$ to about 6 $m^2/g$, about 4 $m^2/g$ to about 8 $m^2/g$, about 4 $m^2/g$ to about 10 $m^2/g$, about 4 $m^2/g$ to about 12 $m^2/g$, about 4 $m^2/g$ to about 14 $m^2/g$, about 4 $m^2/g$ to about 16 $m^2/g$, about 6 $m^2/g$ to about 8 $m^2/g$, about 6 $m^2/g$ to about 10 $m^2/g$, about 6 $m^2/g$ to about 12 $m^2/g$, about 6 $m^2/g$ to about 14 $m^2/g$, about 6 $m^2/g$ to about 16 $m^2/g$, about 8 $m^2/g$ to about 10 $m^2/g$, about 8 $m^2/g$ to about 12 $m^2/g$, about 8 $m^2/g$ to about 14 $m^2/g$, about 8 $m^2/g$ to about 16 $m^2/g$, about 10 $m^2/g$ to about 12 $m^2/g$, about 10 $m^2/g$ to about 14 $m^2/g$, about 10 $m^2/g$ to about 16 $m^2/g$, about 12 $m^2/g$ to about 14 $m^2/g$, about 12 $m^2/g$ to about 16 $m^2/g$, or about 14 $m^2/g$ to about 16 $m^2/g$. In some embodiments, the carbon-based additive has a specific surface area of about 2 $m^2/g$, about 4 $m^2/g$, about 6 $m^2/g$, about 8 $m^2/g$, about 10 $m^2/g$, about 12 $m^2/g$, about 14 $m^2/g$, or about 16 $m^2/g$. In some embodiments, the carbon-based additive has a specific surface area of at least about 2 $m^2/g$, about 4 $m^2/g$, about 6 $m^2/g$, about 8 $m^2/g$, about 10 $m^2/g$, about 12 $m^2/g$, or about 14 $m^2/g$. In some embodiments, the carbon-based additive has a specific surface area of at most about 4 m$^2$/g, about 6 m$^2$/g, about 8 m$^2$/g, about 10 m$^2$/g, about 12 m$^2$/g, about 14 m$^2$/g, or about 16 m$^2$/g.

In some embodiments, the carbon-based additive has a density of about 0.5 g/cm$^3$ to about 4 g/cm$^3$. In some embodiments, the carbon-based additive has a density of about 0.5 g/cm$^3$ to about 0.75 g/cm$^3$, about 0.5 g/cm$^3$ to about 1 g/cm$^3$, about 0.5 g/cm$^3$ to about 1.5 g/cm$^3$, about 0.5 g/cm$^3$ to about 2 g/cm$^3$, about 0.5 g/cm$^3$ to about 2.5 g/cm$^3$, about 0.5 g/cm$^3$ to about 3 g/cm$^3$, about 0.5 g/cm$^3$ to about 3.5 g/cm$^3$, about 0.5 g/cm$^3$ to about 4 g/cm$^3$, about 0.75 g/cm$^3$ to about 1 g/cm$^3$, about 0.75 g/cm$^3$ to about 1.5 g/cm$^3$, about 0.75 g/cm$^3$ to about 2 g/cm$^3$, about 0.75 g/cm$^3$ to about 2.5 g/cm$^3$, about 0.75 g/cm$^3$ to about 3 g/cm$^3$, about 0.75 g/cm$^3$ to about 3.5 g/cm$^3$, about 0.75 g/cm$^3$ to about 4 g/cm$^3$, about 1 g/cm$^3$ to about 1.5 g/cm$^3$, about 1 g/cm$^3$ to about 2 g/cm$^3$, about 1 g/cm$^3$ to about 2.5 g/cm$^3$, about 1 g/cm$^3$ to about 3 g/cm$^3$, about 1 g/cm$^3$ to about 3.5 g/cm$^3$, about 1 g/cm$^3$ to about 4 g/cm$^3$, about 1.5 g/cm$^3$ to about 2 g/cm$^3$, about 1.5 g/cm$^3$ to about 2.5 g/cm$^3$, about 1.5 g/cm$^3$ to about 3 g/cm$^3$, about 1.5 g/cm$^3$ to about 3.5 g/cm$^3$, about 1.5 g/cm$^3$ to about 4 g/cm$^3$, about 2 g/cm$^3$ to about 2.5 g/cm$^3$, about 2 g/cm$^3$ to about 3 g/cm$^3$, about 2 g/cm$^3$ to about 3.5 g/cm$^3$, about 2 g/cm$^3$ to about 4 g/cm$^3$, about 2.5 g/cm$^3$ to about 3 g/cm$^3$, about 2.5 g/cm$^3$ to about 3.5 g/cm$^3$, about 2.5 g/cm$^3$ to about 4 g/cm$^3$, about 3 g/cm$^3$ to about 3.5 g/cm$^3$, about 3 g/cm$^3$ to about 4 g/cm$^3$, or about 3.5 g/cm$^3$ to about 4 g/cm$^3$. In some embodiments, the carbon-based additive has a density of about 0.5 g/cm$^3$, about 0.75 g/cm$^3$, about 1 g/cm$^3$, about 1.5 g/cm$^3$, about 2 g/cm$^3$, about 2.5 g/cm$^3$, about 3 g/cm$^3$, about 3.5 g/cm$^3$, or about 4 g/cm$^3$. In some embodiments, the carbon-based additive has a density of at least about 0.5 g/cm$^3$, about 0.75 g/cm$^3$, about 1 g/cm$^3$, about 1.5 g/cm$^3$, about 2 g/cm$^3$, about 2.5 g/cm$^3$, about 3 g/cm$^3$, or about 3.5 g/cm$^3$. In some embodiments, the carbon-based additive has a density of at most about 0.75 g/cm$^3$, about 1 g/cm$^3$, about 1.5 g/cm$^3$, about 2 g/cm$^3$, about 2.5 g/cm$^3$, about 3 g/cm$^3$, about 3.5 g/cm$^3$, or about 4 g/cm$^3$.

In some embodiments, at least one of the graphene and the graphene oxide has a conductivity of about 1,000 S/m to about 4,000 S/m. In some embodiments, at least one of the graphene and the graphene oxide has a conductivity of about 1,000 S/m to about 1,500 S/m, about 1,000 S/m to about 2,000 S/m, about 1,000 S/m to about 2,500 S/m, about 1,000 S/m to about 3,000 S/m, about 1,000 S/m to about 3,500 S/m, about 1,000 S/m to about 4,000 S/m, about 1,500 S/m to about 2,000 S/m, about 1,500 S/m to about 2,500 S/m, about 1,500 S/m to about 3,000 S/m, about 1,500 S/m to about 3,500 S/m, about 1,500 S/m to about 4,000 S/m, about 2,000 S/m to about 2,500 S/m, about 2,000 S/m to about 3,000 S/m, about 2,000 S/m to about 3,500 S/m, about 2,000 S/m to about 4,000 S/m, about 2,500 S/m to about 3,000 S/m, about 2,500 S/m to about 3,500 S/m, about 2,500 S/m to about 4,000 S/m, about 3,000 S/m to about 3,500 S/m, about 3,000 S/m to about 4,000 S/m, or about 3,500 S/m to about 4,000 S/m. In some embodiments, at least one of the graphene and the graphene oxide has a conductivity of about 1,000 S/m, about 1,500 S/m, about 2,000 S/m, about 2,500 S/m, about 3,000 S/m, about 3,500 S/m, or about 4,000 S/m. In some embodiments, at least one of the graphene and the graphene oxide has a conductivity of at least about 1,000 S/m, about 1,500 S/m, about 2,000 S/m, about 2,500 S/m, about 3,000 S/m, or about 3,500 S/m. In some embodiments, at least one of the graphene and the graphene oxide has a conductivity of at most about 1,500 S/m, about 2,000 S/m, about 2,500 S/m, about 3,000 S/m, about 3,500 S/m, or about 4,000 S/m.

In some embodiments, the reduced graphene oxide comprises reduced graphene oxide sheets. In some embodiments, the reduced graphene oxide sheets have a width, length or both of about 0.3 µm to about 10 µm. In some embodiments, the reduced graphene oxide sheets have a width, length or both of about 0.3 µm to about 0.5 µm, about 0.3 µm to about 1 µm, about 0.3 µm to about 2 µm, about 0.3 µm to about 3 µm, about 0.3 µm to about 4 µm, about 0.3 µm to about 5 µm, about 0.3 µm to about 6 µm, about 0.3 µm to about 7 µm, about 0.3 µm to about 8 µm, about 0.3 µm to about 9 µm, about 0.3 µm to about 10 µm, about 0.5 µm to about 1 µm, about 0.5 µm to about 2 µm, about 0.5 µm to about 3 µm, about 0.5 µm to about 4 µm, about 0.5 µm to about 5 µm, about 0.5 µm to about 6 µm, about 0.5 µm to about 7 µm, about 0.5 µm to about 8 µm, about 0.5 µm to about 9 µm, about 0.5 µm to about 10 µm, about 1 µm to about 2 µm, about 1 µm to about 3 µm, about 1 µm to about 4 µm, about 1 µm to about 5 µm, about 1 µm to about 6 µm, about 1 µm to about 7 µm, about 1 µm to about 8 µm, about 1 µm to about 9 µm, about 1 µm to about 10 µm, about 2 µm to about 3 µm, about 2 µm to about 4 µm, about 2 µm to about 5 µm, about 2 µm to about 6 µm, about 2 µm to about 7 µm, about 2 µm to about 8 µm, about 2 µm to about 9 µm, about 2 µm to about 10 µm, about 3 µm to about 4 µm, about 3 µm to about 5 µm, about 3 µm to about 6 µm, about 3 µm to about 7 µm, about 3 µm to about 8 µm, about 3 µm to about 9 µm, about 3 µm to about 10 µm, about 4 µm to about 5 µm, about 4 µm to about 6 µm, about 4 µm to about 7 µm, about 4 µm to about 8 µm, about 4 µm to about 9 µm, about 4 µm to about 10 µm, about 5 µm to about 6 µm, about 5 µm to about 7 µm, about 5 µm to about 8 µm, about 5 µm to about 9 µm, about 5 µm to about 10 µm, about 6 µm to about 7 µm, about 6 µm to about 8 µm, about 6 µm to about 9 µm, about 6 µm to about 10 µm, about 7 µm to about 8 µm, about 7 µm to about 9 µm, about 7 µm to about 10 µm, about 8 µm to about 9 µm, about 8 µm to about 10 µm, or about 9 µm to about 10 µm. In some embodiments, the reduced graphene oxide sheets have a width, length or both of about 0.3 µm, about 0.5 µm, about 1 µm, about 2 µm, about 3 µm, about 4 µm, about 5 µm, about 6 µm, about 7 µm, about 8 µm, about 9 µm, or about 10 µm. In some embodiments, the reduced graphene oxide sheets have a width, length or both of at least about 0.3 µm, about 0.5 µm, about 1 µm, about 2 µm, about 3 µm, about 4 µm, about 5 µm, about 6 µm, about 7 µm, about 8 µm, or about 9 µm. In some embodiments, the reduced graphene oxide sheets have a width, length or both of at most about 0.5 µm, about 1 µm, about 2 µm, about 3 µm, about 4 µm, about 5 µm, about 6 µm, about 7 µm, about 8 µm, about 9 µm, or about 10 µm.

In some embodiments, the carbon nanotube has an outside diameter of about 20 nm to about 60 nm. In some embodiments, the carbon nanotube has an outside diameter of about 20 nm to about 25 nm, about 20 nm to about 30 nm, about 20 nm to about 35 nm, about 20 nm to about 40 nm, about 20 nm to about 45 nm, about 20 nm to about 50 nm, about 20 nm to about 55 nm, about 20 nm to about 60 nm, about 25 nm to about 30 nm, about 25 nm to about 35 nm, about 25 nm to about 40 nm, about 25 nm to about 45 nm, about 25 nm to about 50 nm, about 25 nm to about 55 nm, about 25 nm to about 60 nm, about 30 nm to about 35 nm, about 30 nm to about 40 nm, about 30 nm to about 45 nm, about 30 nm to about 50 nm, about 30 nm to about 55 nm, about 30 nm to about 60 nm, about 35 nm to about 40 nm, about 35 nm to about 45 nm, about 35 nm to about 50 nm, about 35 nm to about 55 nm, about 35 nm to about 60 nm, about 40 nm to about 45 nm, about 40 nm to about 50 nm, about 40 nm to about 55 nm, about 40 nm to about 60 nm, about 45 nm to about 50 nm, about 45 nm to about 55 nm, about 45 nm to about 60 nm, about 50 nm to about 55 nm, about 50 nm to about 60 nm, or about 55 nm to about 60 nm. In some embodiments, the carbon nanotube has an outside diameter of about 20 nm, about 25 nm, about 30 nm, about 35 nm, about 40 nm, about 45 nm, about 50 nm, about 55 nm, or about 60 nm. In some embodiments, the carbon nanotube has an outside diameter of at least about 20 nm, about 25 nm, about 30 nm, about 35 nm, about 40 nm, about 45 nm, about 50 nm, or about 55 nm. In some embodiments, the carbon nanotube has an outside diameter of at most about 25 nm, about 30 nm, about 35 nm, about 40 nm, about 45 nm, about 50 nm, about 55 nm, or about 60 nm.

In some embodiments, the carbon nanotube has a length of about 0.25 µm to about 4 µm. In some embodiments, the carbon nanotube has a length of about 0.25 µm to about 0.5 µm, about 0.25 µm to about 0.75 µm, about 0.25 µm to about 1 µm, about 0.25 µm to about 1.5 µm, about 0.25 µm to about 2 µm, about 0.25 µm to about 2.5 µm, about 0.25 µm to about 3 µm, about 0.25 µm to about 3.5 µm, about 0.25 µm to about 4 µm, about 0.5 µm to about 0.75 µm, about 0.5 µm to about 1 µm, about 0.5 µm to about 1.5 µm, about 0.5 µm to about 2 µm, about 0.5 µm to about 2.5 µm, about 0.5 µm to about 3 µm, about 0.5 µm to about 3.5 µm, about 0.5 µm to about 4 µm, about 0.75 µm to about 1 µm, about 0.75 µm to about 1.5 µm, about 0.75 µm to about 2 µm, about 0.75 µm to about 2.5 µm, about 0.75 µm to about 3 µm, about 0.75 µm to about 3.5 µm, about 0.75 µm to about 4 µm, about 1 µm to about 1.5 µm, about 1 µm to about 2 µm, about 1 µm to about 2.5 µm, about 1 µm to about 3 µm, about 1 µm to about 3.5 µm, about 1 µm to about 4 µm, about 1.5 µm to about 2 µm, about 1.5 µm to about 2.5 µm, about 1.5 µm to about 3 µm, about 1.5 µm to about 3.5 µm, about 1.5 µm to about 4 µm, about 2 µm to about 2.5 µm, about 2 µm to about 3 µm, about 2 µm to about 3.5 µm, about 2 µm to about 4 µm, about 2.5 µm to about 3 µm, about 2.5 µm to about 3.5 µm, about 2.5 µm to about 4 µm, about 3 µm to about 3.5 µm, about 3 µm to about 4 µm, or about 3.5 µm to about 4 µm. In some embodiments, the carbon nanotube has a length of about 0.25 µm, about 0.5 µm, about 0.75 µm, about 1 µm, about 1.5 µm, about 2 µm, about 2.5 µm, about 3 µm, about 3.5 µm, or about 4 µm. In some embodiments, the carbon nanotube has a length of at least about 0.25 µm, about 0.5 µm, about 0.75 µm, about 1 µm, about 1.5 µm, about 2 µm, about 2.5 µm, about 3 µm, or about 3.5 µm. In some embodiments, the carbon nanotube has a length of at most about 0.5 µm, about 0.75 µm, about 1 µm, about 1.5 µm, about 2 µm, about 2.5 µm, about 3 µm, about 3.5 µm, or about 4 µm.

In some embodiments, the carbon nanotube has a specific surface area of greater than about 30 m$^2$/g, 40 m$^2$/g, 50 m$^2$/g, 60 m$^2$/g, 70 m$^2$/g, 80 m$^2$/g, 90 m$^2$/g, 100 m$^2$/g, 110 m$^2$/g, 120 m$^2$/g, or more including increments therein. In some embodiments, the carbon nanotube has an electrical conductivity of greater than about 50 s/cm, 60 s/cm, 70 s/cm, 80 s/cm, 90 s/cm, 100 S/cm 120 s/cm, 140 s/cm, 160 s/cm, 180 s/cm, 200 s/cm, or more including increments therein.

In some embodiments, the carbon-based additive has a mean particle size of about 2 µm to about 30 µm. In some embodiments, the carbon-based additive has a mean particle size of about 2 µm to about 4 µm, about 2 µm to about 6 µm, about 2 µm to about 8 µm, about 2 µm to about 10 µm, about 2 µm to about 14 µm, about 2 µm to about 18 µm, about 2 µm to about 22 µm, about 2 µm to about 26 µm, about 2 µm to about 30 µm, about 4 µm to about 6 µm, about 4 µm to about 8 µm, about 4 µm to about 10 µm, about 4 µm to about 14 µm, about 4 µm to about 18 µm, about 4 µm to about 22 µm, about 4 µm to about 26 µm, about 4 µm to about 30 µm, about 6 µm to about 8 µm, about 6 µm to about 10 µm, about 6 µm to about 14 µm, about 6 µm to about 18 µm, about 6 µm to about 22 µm, about 6 µm to about 26 µm, about 6 µm to about 30 µm, about 8 µm to about 10 µm, about 8 µm to about 14 µm, about 8 µm to about 18 µm, about 8 µm to about 22 µm, about 8 µm to about 26 µm, about 8 µm to about 30 µm, about 10 µm to about 14 µm, about 10 µm to about 18 µm, about 10 µm to about 22 µm, about 10 µm to about 26 µm, about 10 µm to about 30 µm, about 14 µm to about 18 µm, about 14 µm to about 22 µm, about 14 µm to about 26 µm, about 14 µm to about 30 µm, about 18 µm to about 22 µm, about 18 µm to about 26 µm, about 18 µm to about 30 µm, about 22 µm to about 26 µm, about 22 µm to about 30 µm, or about 26 µm to about 30 µm. In some embodiments, the carbon-based additive has a mean particle size of about 2 µm, about 4 µm, about 6 µm, about 8 µm, about 10 µm, about 14 µm, about 18 µm, about 22 µm, about 26 µm, or about 30 µm. In some embodiments, the carbon-based additive has a mean particle size of at least about 2 µm, about 4 µm, about 6 µm, about 8 µm, about 10 µm, about 14 µm, about 18 µm, about 22 µm, or about 26 µm. In some embodiments, the carbon-based additive has a mean particle size of at most about 4 µm, about 6 µm, about 8 µm, about 10 µm, about 14 µm, about 18 µm, about 22 µm, about 26 µm, or about 30 µm.

In some embodiments, the electromagnetic shield has a thickness of about 10 µm to about 2,000 µm. In some embodiments, the electromagnetic shield has a thickness of about 10 µm to about 100 µm, about 10 µm to about 250 µm, about 10 µm to about 500 µm, about 10 µm to about 750 µm, about 10 µm to about 1,000 µm, about 10 µm to about 1,250 µm, about 10 µm to about 1,500 µm, about 10 µm to about 1,750 µm, about 10 µm to about 2,000 µm, about 100 µm to about 250 µm, about 100 µm to about 500 µm, about 100 µm to about 750 µm, about 100 µm to about 1,000 µm, about 100 µm to about 1,250 µm, about 100 µm to about 1,500 µm, about 100 µm to about 1,750 µm, about 100 µm to about 2,000 µm, about 250 µm to about 500 µm, about 250 µm to about 750 µm, about 250 µm to about 1,000 µm, about 250 µm to about 1,250 µm, about 250 µm to about 1,500 µm, about 250 µm to about 1,750 µm, about 250 µm to about 2,000 µm, about 500 µm to about 750 µm, about 500 µm to about 1,000 µm, about 500 µm to about 1,250 µm, about 500 µm to about 1,500 µm, about 500 µm to about 1,750 µm, about 500 µm to about 2,000 µm, about 750 µm to about 1,000 µm, about 750 µm to about 1,250 µm, about 750 µm to about 1,500 µm, about 750 µm to about 1,750 µm, about 750 µm to about 2,000 µm, about 1,000 µm to about 1,250 µm, about 1,000 µm to about 1,500 µm, about 1,000 µm to about 1,750 µm, about 1,000 µm to about 2,000 µm, about 1,250 µm to about 1,500 µm, about 1,250 µm to about 1,750 µm, about 1,250 µm to about 2,000 µm, about 1,500 µm to about 1,750 µm, about 1,500 µm to about 2,000 µm, or about 1,750 µm to about 2,000 µm, including increments therein. In some embodiments, the electromagnetic shield has a thickness of about 10 µm, about 100 µm, about 250 µm, about 500 µm, about 750 µm, about 1,000 µm, about 1,250 µm, about 1,500 µm, about 1,750 µm, or about 2,000 µm. In some embodiments, the electromagnetic shield has a thickness of at least about 10 µm, about 100 µm, about 250 µm, about 500 µm, about 750 µm, about 1,000 µm, about 1,250 µm, about 1,500 µm, or about 1,750 µm. In some embodiments, the electromagnetic shield has a thickness of at most about 100 µm, about 250 µm, about 500 µm, about 750 µm, about 1,000 µm, about 1,250 µm, about 1,500 µm, about 1,750 µm, or about 2,000 µm. In some embodiments, the conductive additives, binders, or both, herein enable the shield thicknesses herein.

In some embodiments, the electromagnetic shield has a thermal conductivity of about 1 W/mK to about 5 W/mK. In some embodiments, the electromagnetic shield has a thermal conductivity of at least about 1 W/mK, 1.5 W/mK, 2 W/mK, 2.5 W/mK, 3 W/mK, 3.5 W/mK, 4 W/mK, or 4.5 W/mK, including increments therein. In some embodiments, the conductive additives, binders, or both, herein enable the high thermal conductivities herein.

EMI Shield Coatings

Provided herein are EMI shielding coatings comprising a conductive additive and a binder. In some embodiments, the EMI shielding coating further comprises a solvent, a surfactant, a defoamer, or any combination thereof. In some embodiments, the coating does not comprise at least one of the surfactant, and the defoamer. In some embodiments, the conductive additive and the binder form a carbon-polymer nanocomposite. In some embodiments, the conductive additive and the binder form a physically robust and chemically resistant matrix with a high electrical conductivity. In some embodiments, the conductive additive acts as a physical/mechanical enhancer for the binder matrix, enabling improved hardness, tensile strength, and flexibility.

In some embodiments, the EMI shielding coating is a one-part, aqueous conductive paint. In some embodiments, the EMI shielding coating is applied to a surface by spraying, rolling, brushing or any combination thereof. In some embodiments, applying the EMI shielding coating does not require heat treatment. In some embodiments, the EMI shielding coating is non-solvent based, enabling its application to, for example, plastics that are prone to solvent dissolution, such as polystyrene and polyethylene. In some embodiments, the EMI shielding coating adheres strongly to plastic, metal, glass and textile substrates. In some embodiments, the EMI shielding coating is safe for heat sensitive substrates.

In some embodiments, the EMI shielding coating is easily applied to a variety of substrates for a variety of applications. In some embodiments, the EMI shielding coating is configured for application to a substrate by spraying. In some embodiments, the EMI shielding coating is configured for application to a substrate by air spraying. In some embodiments, the ability of the EMI shielding coating to be air sprayed onto a substrate enables its application to substrates of various shapes and materials. In some embodiments, the ability of the EMI shielding coating to be air sprayed onto a substrate enables its application to substrates with greater thickness uniformity. In some embodiments, the viscosities, particles sizes, concentrations, and components of the EMI shielding coatings herein enable its application by spray coating.

In some embodiments, when painted on a surface, the EMI shielding coating attenuates electromagnetic interference (EMI), radio frequency interference (RFI), or both. In some embodiments, when painted on a surface, the EMI shielding coating dissipates. In some embodiments, when painted on an surface of an electronics enclosure, the EMI shielding coating dissipates heat from the electronics therein to prevent or avoid their thermal shutdown. In some embodiments, the EMI shielding coating is highly resistant to chemicals, corrosion, and scratches.

In some embodiments, the conductive additive comprises a carbon-based additive. In some embodiments, the carbon-based additive comprises, graphite, graphene, reduced graphene, graphene oxide, reduced graphene oxide, carbon black, cabot carbon, a carbon nanotube, a functionalized carbon nanotube, or any combination thereof. In some embodiments, the carbon-based additive is reduced. In some embodiments, the carbon-based additive is porous. In some embodiments, the carbon-based additive comprises nanoplatelets, nanofibers, nanotubes, nanoparticles, nanorods, nanowires, nanoflowers, nanoflakes, nanofibers, nanoplatelets, nanoribbons, nanocubes, bipyramids, nanodiscs, nanoplates, nanodendrites, nanoleaves, nanospheres, quantum spheres, quantum dots, nanosprings, nanosheets, or any combination thereof. In some embodiments, the carbon nanotube is a multi-walled nanotube, a single-walled nanotube, or a combination thereof. In some embodiments, the functionalized carbon nanotube is functionalized with hydroxide, carboxylic acid, or both. In some embodiments, the conductive additives described herein provide high conductivity, strength, and resilience.

In some embodiments, the binder comprises a polymeric binder. In some embodiments, the polymeric binder comprises styrene butadiene rubber, polyvinylidene fluoride, polytetrafluoroethylene, polyvinyl pyrrolidone, ethyl cellulose, polyurethane, polyester, or any combination thereof.

In some embodiments, the solvent comprises a polar aprotic solvent, or a polar protic solvent. In some embodiments, the polar aprotic solvent comprises N-Methyl-2-pyrrolidone, or dichloromethane, tetrahydrofuran, ethyl acetate, acetone, dimethylformamide, acetonitrile, dimethyl sulfoxide, propylene carbonate, or any combination thereof. In some embodiments, the polar protic solvent comprises water, formic acid, n-butanol, isopropanol, nitromethane, ethanol, methanol, acetic acid, or any combination thereof.

In some embodiments, the surfactant comprises an acid, a nonionic surfactant, or any combination thereof. In some embodiments, the acid comprises perfluorooctanoic acid, perfluorooctane sulfonate, perfluorohexane sulfonic acid, perfluorononanoic acid, perfluorodecanoic acid, or any combination thereof. In some embodiments, the nonionic surfactant comprises polyethylene glycol alkyl ether, octaethylene glycol monododecyl ether, pentaethylene glycol monododecyl ether, polypropylene glycol alkyl ether, glucoside alkyl ether, decyl glucoside, lauryl glucoside, octyl glucoside, polyethylene glycol octylphenyl ether, dodecyldimethylamine oxide, polyethylene glycol alkylphenyl ether, polyethylene glycol octylphenyl ether, Triton X-100, polyethylene glycol alkylphenyl ether, nonoxynol-9, glycerol alkyl ester polysorbate, sorbitan alkyl ester, polyethoxylated tallow amine, Dynol 604, Zonyl F5-300, or any combination thereof.

In some embodiments, the defoamer comprises an insoluble oil, a silicone, a glycol, a stearate, an organic solvent, Surfynol DF-1100, alkyl polyacrylate, or any combination thereof. In some embodiments, the insoluble oil comprises mineral oil, vegetable oil, white oil, or any combination thereof. In some embodiments, the silicone comprises polydimethylsiloxane, silicone glycol, a fluorosilicone, or any combination thereof. In some embodiments, the glycol comprises polyethylene glycol, ethylene glycol, propylene glycol, or any combination thereof. In some embodiments, the stearate comprises glycol stearate, stearin, or any combination thereof. In some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

In some embodiments, the viscosity modifier comprises N-methyl-2-pyrrolidone, ethanol, isopropyl alcohol, cyclohexanone, terpineol 3-methoxy-3-methyl-1-butanol, 4-hydroxyl-4-methyl-pentane-2-one, methyl isobutyl ketone, or any combination thereof.

In some embodiments, the coating comprises more than one conductive additive, for example, two, three, or four or more conductive additives. In some embodiments, the coating comprises one or more of graphite, graphene (or reduced graphene oxide), carbon black (e.g., cabot carbon, C45 or C65), carbon nanotubes (e.g., functionalized carbon nanotubes OH or COOH), or carbon fiber. The percentage by weight of any given conductive additive may be independently between 2% to 99% (e.g., 2% of conductive additive 1 and 3% of conductive additive 2). In some embodiments, the coating comprises a percentage by weight of the conductive additive of about 2% to about 99%. In some embodiments, the coating comprises a percentage by weight of the conductive additive of about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 99%, about 5% to about 10%, about 5% to about 20%, about 5% to about 30%, about 5% to about 40%, about 5% to about 50%, about 5% to about 60%, about 5% to about 70%, about 5% to about 80%, about 5% to about 99%, about 10% to about 20%, about 10% to about 30%, about 10% to about 40%, about 10% to about 50%, about 10% to about 60%, about 10% to about 70%, about 10% to about 80%, about 10% to about 99%, about 20% to about 30%, about 20% to about 40%, about 20% to about 50%, about 20% to about 60%, about 20% to about 70%, about 20% to about 80%, about 20% to about 99%, about 30% to about 40%, about 30% to about 50%, about 30% to about 60%, about 30% to about 70%, about 30% to about 80%, about 30% to about 99%, about 40% to about 50%, about 40% to about 60%, about 40% to about 70%, about 40% to about 80%, about 40% to about 99%, about 50% to about 60%, about 50% to about 70%, about 50% to about 80%, about 50% to about 99%, about 60% to about 70%, about 60% to about 80%, about 60% to about 99%, about 70% to about 80%, about 70% to about 99%, or about 80% to about 99%. In some embodiments, the coating comprises a percentage by weight of the conductive additive of about 2%, about 5%, about 10%, about 20%, about 30%, about 40%, about 50%, about 60%, about 70%, about 80%, or about 99%. In some embodiments, the coating comprises a percentage by weight of the conductive additive of at least about 2%, about 5%, about 10%, about 20%, about 30%, about 40%, about 50%, about 60%, about 70%, or about 80%. In some embodiments, the coating comprises a percentage by weight of the conductive additive of at most about 5%, about 10%, about 20%, about 30%, about 40%, about 50%, about 60%, about 70%, about 80%, or about 99%.

In some embodiments, the coating comprises a percentage by weight of the binder of about 2% to about 90%. In some embodiments, the coating comprises a percentage by weight of the binder of about 2% to about 5%, about 2% to about 10%, about 2% to about 20%, about 2% to about 30%, about 2% to about 40%, about 2% to about 50%, about 2% to about 60%, about 2% to about 70%, about 2% to about 80%, about 2% to about 90%, about 5% to about 10%, about 5% to about 20%, about 5% to about 30%, about 5% to about 40%, about 5% to about 50%, about 5% to about 60%, about 5% to about 70%, about 5% to about 80%, about 5% to about 90%, about 10% to about 20%, about 10% to about 30%, about 10% to about 40%, about 10% to about 50%, about 10% to about 60%, about 10% to about 70%, about 10% to about 80%, about 10% to about 90%, about 20% to about 30%, about 20% to about 40%, about 20% to about 50%, about 20% to about 60%, about 20% to about 70%, about 20% to about 80%, about 20% to about 90%, about 30% to about 40%, about 30% to about 50%, about 30% to about 60%, about 30% to about 70%, about 30% to about 80%, about 30% to about 90%, about 40% to about 50%, about 40% to about 60%, about 40% to about 70%, about 40% to about 80%, about 40% to about 90%, about 50% to about 60%, about 50% to about 70%, about 50% to about 80%, about 50% to about 90%, about 60% to about 70%, about 60% to about 80%, about 60% to about 90%, about 70% to about 80%, about 70% to about 90%, or about 80% to about 90%. In some embodiments, the coating comprises a percentage by weight of the binder of about 2%, about 5%, about 10%, about 20%, about 30%, about 40%, about 50%, about 60%, about 70%, about 80%, or about 90%. In some embodiments, the coating comprises a percentage by weight of the binder of at least about 2%, about 5%, about 10%, about 20%, about 30%, about 40%, about 50%, about 60%, about 70%, or about 80%. In some embodiments, the coating comprises a percentage by weight of the binder of at most about 5%, about 10%, about 20%, about 30%, about 40%, about 50%, about 60%, about 70%, about 80%, or about 90%.

In some embodiments, the coating comprises a percentage by weight of the solvent of about 40% to about 90%. In some embodiments, the coating comprises a percentage by weight of the solvent of at least about 40%, about 45%, about 50%, about 55%, about 60%, about 65%, about 70%, about 75%, about 80%, or about 85%. In some embodiments, the coating comprises a percentage by weight of the solvent of at most about 45%, about 50%, about 55%, about 60%, about 65%, about 70%, about 75%, about 80%, about 85%, or about 90%.

In some embodiments, the coating comprises a percentage by weight of the surfactant of about 0.01% to about 10%. In some embodiments, the coating comprises a percentage by weight of the surfactant of at least about 0.01%, about 0.05%, about 0.1%, about 0.5%, about 1%, about 2%, about 3%, about 4%, about 5%, about 6%, or about 8%. In some embodiments, the coating comprises a percentage by weight of the surfactant of at most about 0.05%, about 0.1%, about 0.5%, about 1%, about 2%, about 3%, about 4%, about 5%, about 6%, about 8%, or about 10%.

In some embodiments, the coating comprises a percentage by weight of the defoamer of about 0.1% to about 5%. In some embodiments, the coating comprises a percentage by weight of the defoamer of at least about 0.1%, about 0.25%, about 0.5%, about 0.75%, about 1%, about 2%, about 3%, or about 4%. In some embodiments, the coating comprises a percentage by weight of the defoamer of at most about 0.25%, about 0.5%, about 0.75%, about 1%, about 2%, about 3%, about 4%, or about 5%.

In some embodiments, the coating has a solid content by weight of about 20% to about 90%. In some embodiments, the coating has a solid content by weight of about 40% to about 45%. In some embodiments, the coating has a solid content by weight of at least about 20%, 30%, 40%, 50%, 60%, 70%, or 80%, including increments therein. In some embodiments, the coating has a solid content by weight of at most about 30%, 40%, 50%, 60%, 70%, 80%, or 90% including increments therein.

In some embodiments, the coating has a viscosity of about 1,000 MPa/s to about 5,000 MPa/s. In some embodiments, the coating has a viscosity of about 1,000 MPa/s to about 1,500 MPa/s, about 1,000 MPa/s to about 2,000 MPa/s, about 1,000 MPa/s to about 2,500 MPa/s, about 1,000 MPa/s to about 3,000 MPa/s, about 1,000 MPa/s to about 3,500 MPa/s, about 1,000 MPa/s to about 4,000 MPa/s, about 1,000 MPa/s to about 4,500 MPa/s, about 1,000 MPa/s to about 5,000 MPa/s, about 1,500 MPa/s to about 2,000 MPa/s, about 1,500 MPa/s to about 2,500 MPa/s, about 1,500 MPa/s to about 3,000 MPa/s, about 1,500 MPa/s to about 3,500 MPa/s, about 1,500 MPa/s to about 4,000 MPa/s, about 1,500 MPa/s to about 4,500 MPa/s, about 1,500 MPa/s to about 5,000 MPa/s, about 2,000 MPa/s to about 2,500 MPa/s, about 2,000 MPa/s to about 3,000 MPa/s, about 2,000 MPa/s to about 3,500 MPa/s, about 2,000 MPa/s to about 4,000 MPa/s, about 2,000 MPa/s to about 4,500 MPa/s, about 2,000 MPa/s to about 5,000 MPa/s, about 2,500 MPa/s to about 3,000 MPa/s, about 2,500 MPa/s to about 3,500 MPa/s, about 2,500 MPa/s to about 4,000 MPa/s, about 2,500 MPa/s to about 4,500 MPa/s, about 2,500 MPa/s to about 5,000 MPa/s, about 3,000 MPa/s to about 3,500 MPa/s, about 3,000 MPa/s to about 4,000 MPa/s, about 3,000 MPa/s to about 4,500 MPa/s, about 3,000 MPa/s to about 5,000 MPa/s, about 3,500 MPa/s to about 4,000 MPa/s, about 3,500 MPa/s to about 4,500 MPa/s, about 3,500 MPa/s to about 5,000 MPa/s, about 4,000 MPa/s to about 4,500 MPa/s, about 4,000 MPa/s to about 5,000 MPa/s, or about 4,500 MPa/s to about 5,000 MPa/s, including increments therein. In some embodiments, the coating has a viscosity of about 1,000 MPa/s, about 1,500 MPa/s, about 2,000 MPa/s, about 2,500 MPa/s, about 3,000 MPa/s, about 3,500 MPa/s, about 4,000 MPa/s, about 4,500 MPa/s, or about 5,000 MPa/s. In some embodiments, the coating has a viscosity of at least about 1,000 MPa/s, about 1,500 MPa/s, about 2,000 MPa/s, about 2,500 MPa/s, about 3,000 MPa/s, about 3,500 MPa/s, about 4,000 MPa/s, or about 4,500 MPa/s. In some embodiments, the coating has a viscosity of at most about 1,500 MPa/s, about 2,000 MPa/s, about 2,500 MPa/s, about 3,000 MPa/s, about 3,500 MPa/s, about 4,000 MPa/s, about 4,500 MPa/s, or about 5,000 MPa/s. In some embodiments, the viscosity of the coatings herein enable their application to a wide variety of substrates and surfaces of different materials and shapes. In some embodiments, the viscosity of the coatings herein enable their application to a substrate through various coating means.

In some embodiments, the electromagnetic coating has a thermal conductivity when dry of about 1 W/mK to about 5 W/mK. In some embodiments, the electromagnetic coating has a thermal conductivity when dry of at least about 1 W/mK, 1.5 W/mK, 2 W/mK, 2.5 W/mK, 3 W/mK, 3.5 W/mK, 4 W/mK, or 4.5 W/mK, including increments therein. In some embodiments, the conductive additives, binders, or both herein enable the high thermal conductivity of the coating. In some embodiments, higher thermal conductivities enable the coating herein to draw more heat away from devices creating heat and neighboring heat sensitive elements, improving the functionality of all such heat sensitive elements.

Methods of Forming EMI Shields

Figure 2C:
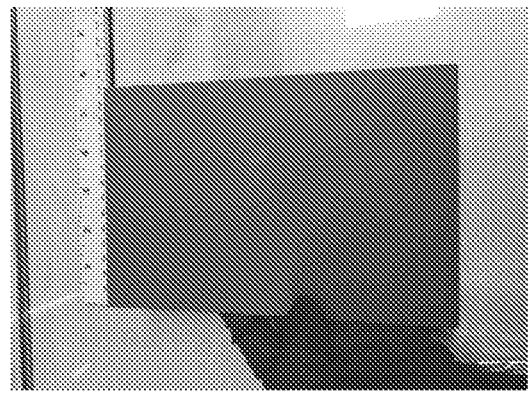
FIG. 2C shows a third perspective view of an EMI shield.
Figure 2B:
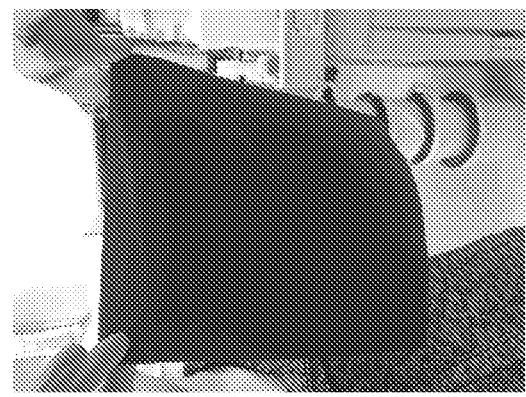
FIG. 2B shows a second perspective view of an EMI shield.
Figure 2A:
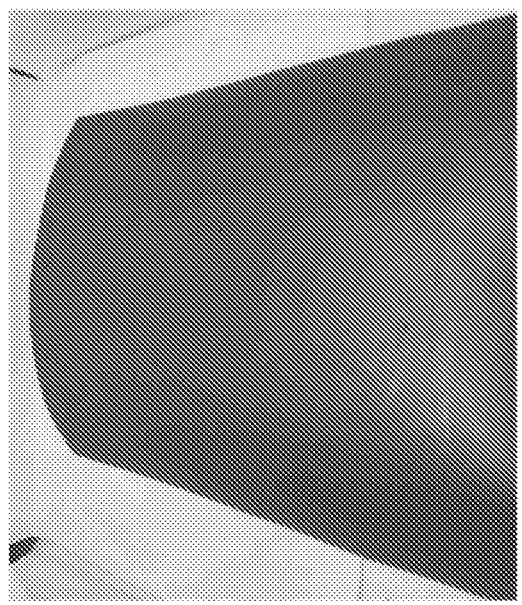
FIG. 2A shows a first perspective view of an EMI shield.

Provided herein are methods of forming an electromagnetic shield comprising forming a coating comprising: a conductive additive; a binder; a solvent; a surfactant; and a defoamer; depositing the coating on a substrate; and drying the coating on the substrate. In some embodiments, a set thickness of the coating is applied to the substrate. In some embodiments, a greater thickness of the coating applied to the substrate forms a shield with a greater electromagnetic shielding performance. FIGS. 2A-2C show images of examples of EMI shields consistent with the present disclosure.

In some embodiments, drying the coating on the substrate occurs for a period of time of about 5 minutes to about 60 minutes. In some embodiments, drying the coating on the substrate occurs for a period of time of at least about 5 minutes, 10 minutes, 20 minutes, 30 minutes, 40 minutes, or 50 minutes, including increments therein. In some embodiments, drying the coating on the substrate occurs for a period of time of at most about 10 minutes, 20 minutes, 30 minutes, 40 minutes, 50 minutes, or 60 minutes, including increments therein. In some embodiments, the method of forming an electromagnetic shield further comprises depositing a second coat of the coating on a substrate; and drying the second coat. In some embodiments, drying the second coat occurs for a period of time of about 5 minutes to about 60 minutes. In some embodiments, drying the second coat occurs for a period of time of at least about 5 minutes, 10 minutes, 20 minutes, 30 minutes, 40 minutes, or 50 minutes, including increments therein. In some embodiments, drying the second coat occurs for a period of time of at most about 10 minutes, 20 minutes, 30 minutes, 40 minutes, 50 minutes, or 60 minutes, including increments therein.

In some embodiments, the conductive additive comprises a carbon-based additive. In some embodiments, the carbon-based additive comprises, graphite, graphene, reduced graphene, graphene oxide, reduced graphene oxide, carbon black, cabot carbon, a carbon nanotube, a functionalized carbon nanotube, or any combination thereof. In some embodiments, the carbon-based additive is reduced. In some embodiments, the carbon-based additive is porous. In some embodiments, the carbon-based additive comprises nanoplatelets, nanofibers, nanotubes, nanoparticles, nanorods, nanowires, nanoflowers, nanoflakes, nanofibers, nanoplatelets, nanoribbons, nanocubes, bipyramids, nanodiscs, nanoplates, nanodendrites, nanoleaves, nanospheres, quantum spheres, quantum dots, nanosprings, nanosheets, or any combination thereof. In some embodiments, the carbon nanotube is a multi-walled nanotube, a single-walled nanotube, or a combination thereof. In some embodiments, the functionalized carbon nanotube is functionalized with hydroxide, carboxylic acid, or both.

In some embodiments, the binder comprises a polymeric binder. In some embodiments, the polymeric binder comprises styrene butadiene rubber, polyvinylidene fluoride, polytetrafluoroethylene, polyvinyl pyrrolidone, ethyl cellulose, polyurethane, polyester, or any combination thereof.

In some embodiments, the solvent comprises a polar aprotic solvent, or a polar protic solvent. In some embodiments, the polar aprotic solvent comprises N-Methyl-2-pyrrolidone, or dichloromethane, tetrahydrofuran, ethyl acetate, acetone, dimethylformamide, acetonitrile, dimethyl sulfoxide, propylene carbonate, or any combination thereof. In some embodiments, the polar protic solvent comprises water, formic acid, n-butanol, isopropanol, nitromethane, ethanol, methanol, acetic acid, or any combination thereof.

In some embodiments, the surfactant comprises an acid, a nonionic surfactant, or any combination thereof. In some embodiments, the acid comprises perfluorooctanoic acid, perfluorooctane sulfonate, perfluorohexane sulfonic acid, perfluorononanoic acid, perfluorodecanoic acid, or any combination thereof. In some embodiments, the nonionic surfactant comprises polyethylene glycol alkyl ether, octaethylene glycol monododecyl ether, pentaethylene glycol monododecyl ether, polypropylene glycol alkyl ether, glucoside alkyl ether, decyl glucoside, lauryl glucoside, octyl glucoside, polyethylene glycol octylphenyl ether, dodecyldimethylamine oxide, polyethylene glycol alkylphenyl ether, polyethylene glycol octylphenyl ether, Triton X-100, polyethylene glycol alkylphenyl ether, nonoxynol-9, glycerol alkyl ester polysorbate, sorbitan alkyl ester, polyethoxylated tallow amine, Dynol 604, Zonyl F5-300, or any combination thereof.

In some embodiments, the defoamer comprises an insoluble oil, a silicone, a glycol, a stearate, an organic solvent, Surfynol DF-1100, alkyl polyacrylate, or any combination thereof. In some embodiments, the insoluble oil comprises mineral oil, vegetable oil, white oil, or any combination thereof. In some embodiments, the silicone comprises polydimethylsiloxane, silicone glycol, a fluorosilicone, or any combination thereof. In some embodiments, the glycol comprises polyethylene glycol, ethylene glycol, propylene glycol, or any combination thereof. In some embodiments, the stearate comprises glycol stearate, stearin, or any combination thereof. In some embodiments, the organic solvent comprises ethanol, isopropyl alcohol, N-methyl-2-pyrrolidone, cyclohexanone, terpineol, 3-methoxy-3-methyl-1-butanol, 4-hydroxyl-4-methyl-pentan-2-one, methyl isobutyl ketone, or any combination thereof.

In some embodiments, the viscosity modifier comprises N-methyl-2-pyrrolidone, ethanol, isopropyl alcohol, cyclohexanone, terpineol 3-methoxy-3-methyl-1-butanol, 4-hydroxyl-4-methyl-pentane-2-one, methyl isobutyl ketone, or any combination thereof.

In some embodiments, the substrate comprises a plastic, a metal, a glass, a fabric, or any combination thereof. In some embodiments, the metal comprises copper, aluminum, steel, stainless steel, or any combination thereof. In some embodiments, the plastic comprises a thermoplastic. In some embodiments, the thermoplastic comprises polyethylene terephthalate, polyglycolic acid, polylactic acid, polycaprolactone, polyhydroxyalkanoate, polyhydroxybutyrate, polyethylene adipate, polybutylene succinate, poly(3-hydroxybutyrate-co-3-hydroxyvalerate), polybutylene terephthalate, polytrimethylene terephthalate, polyethylene naphthalate, or any combination thereof. In some embodiments, a set thickness of the coating is deposited on the substrate. In some embodiments, the method does not comprise depositing the coating on the substrate. In some embodiments, the method further comprises removing the dried coating from the substrate.

Figure 15:
FIG. 15 shows an image of applying the coating to a substrate.

In some embodiments, forming the coating comprises: mixing the coating; breaking down agglomerates in the coating; removing air bubbles from the coating; or any combination thereof. In some embodiments, the mixing is performed by an acoustic mixer, a planetary mixer, a powder mixer, or any combination thereof. In some embodiments, mixing the coating is performed at a speed of about 25 rpm to about 200 rpm. In some embodiments, the breaking down of the agglomerates in the coating is performed by a high shear mixer. In some embodiments, the high sheer mixer rotates at a speed of about 1,000 rpm to about 4,000 rpm. In some embodiments, the removing of the air bubbles from the coating is performed by a vacuum mixer. In some embodiments, depositing the coating on the substrate comprises depositing the coating on the substrate with a coating machine, a doctor's blade, a table-top coater, an air sprayer, or any combination thereof. In some embodiments, the coating machine is a slot die coating machine. In some embodiments, depositing the coating on the substrate comprises depositing the coating on at most a portion of the substrate. FIG. 15 shows an image of applying the coating to a substrate. In some embodiments, the method further comprises calendaring the electromagnetic shield. In some embodiments, calendaring is performed by a roll to roll calendaring machine.

In some embodiments, drying the coating on the substrate comprises drying at a temperature of about 20° C. to about 120° C. In some embodiments, drying the coating on the substrate comprises drying at a temperature of about 20° C. to about 30° C., about 20° C. to about 40° C., about 20° C. to about 50° C., about 20° C. to about 60° C., about 20° C. to about 70° C., about 20° C. to about 80° C., about 20° C. to about 90° C., about 20° C. to about 100° C., about 20° C. to about 110° C., about 20° C. to about 120° C., about 30° C. to about 40° C., about 30° C. to about 50° C., about 30° C. to about 60° C., about 30° C. to about 70° C., about 30° C. to about 80° C., about 30° C. to about 90° C., about 30° C. to about 100° C., about 30° C. to about 110° C., about 30° C. to about 120° C., about 40° C. to about 50° C., about 40° C. to about 60° C., about 40° C. to about 70° C., about 40° C. to about 80° C., about 40° C. to about 90° C., about 40° C. to about 100° C., about 40° C. to about 110° C., about 40° C. to about 120° C., about 50° C. to about 60° C., about 50° C. to about 70° C., about 50° C. to about 80° C., about 50° C. to about 90° C., about 50° C. to about 100° C., about 50° C. to about 110° C., about 50° C. to about 120° C., about 60° C. to about 70° C., about 60° C. to about 80° C., about 60° C. to about 90° C., about 60° C. to about 100° C., about 60° C. to about 110° C., about 60° C. to about 120° C., about 70° C. to about 80° C., about 70° C. to about 90° C., about 70° C. to about 100° C., about 70° C. to about 110° C., about 70° C. to about 120° C., about 80° C. to about 90° C., about 80° C. to about 100° C., about 80° C. to about 110° C., about 80° C. to about 120° C., about 90° C. to about 100° C., about 90° C. to about 110° C., about 90° C. to about 120° C., about 100° C. to about 110° C., about 100° C. to about 120° C., or about 110° C. to about 120° C. In some embodiments, drying the coating on the substrate comprises drying at a temperature of about 20° C., about 30° C., about 40° C., about 50° C., about 60° C., about 70° C., about 80° C., about 90° C., about 100° C., about 110° C., or about 120° C. In some embodiments, drying the coating on the substrate comprises drying at a temperature of at least about 20° C., about 30° C., about 40° C., about 50° C., about 60° C., about 70° C., about 80° C., about 90° C., about 100° C., or about 110° C. In some embodiments, drying the coating on the substrate comprises drying at a temperature of at most about 30° C., about 40° C., about 50° C., about 60° C., about 70° C., about 80° C., about 90° C., about 100° C., about 110° C., or about 120° C.

In some embodiments, at least one of the breaking down of the agglomerates in the coating and the removing of the air bubbles from the coating is performed until the coating has a viscosity of about 1,000 MPa/s to about 5,000 MPa/s. In some embodiments, at least one of the breaking down of the agglomerates in the coating and the removing of the air bubbles from the coating is performed until the coating has a viscosity of about 1,000 MPa/s to about 1,500 MPa/s, about 1,000 MPa/s to about 2,000 MPa/s, about 1,000 MPa/s to about 2,500 MPa/s, about 1,000 MPa/s to about 3,000 MPa/s, about 1,000 MPa/s to about 3,500 MPa/s, about 1,000 MPa/s to about 4,000 MPa/s, about 1,000 MPa/s to about 4,500 MPa/s, about 1,000 MPa/s to about 5,000 MPa/s, about 1,500 MPa/s to about 2,000 MPa/s, about 1,500 MPa/s to about 2,500 MPa/s, about 1,500 MPa/s to about 3,000 MPa/s, about 1,500 MPa/s to about 3,500 MPa/s, about 1,500 MPa/s to about 4,000 MPa/s, about 1,500 MPa/s to about 4,500 MPa/s, about 1,500 MPa/s to about 5,000 MPa/s, about 2,000 MPa/s to about 2,500 MPa/s, about 2,000 MPa/s to about 3,000 MPa/s, about 2,000 MPa/s to about 3,500 MPa/s, about 2,000 MPa/s to about 4,000 MPa/s, about 2,000 MPa/s to about 4,500 MPa/s, about 2,000 MPa/s to about 5,000 MPa/s, about 2,500 MPa/s to about 3,000 MPa/s, about 2,500 MPa/s to about 3,500 MPa/s, about 2,500 MPa/s to about 4,000 MPa/s, about 2,500 MPa/s to about 4,500 MPa/s, about 2,500 MPa/s to about 5,000 MPa/s, about 3,000 MPa/s to about 3,500 MPa/s, about 3,000 MPa/s to about 4,000 MPa/s, about 3,000 MPa/s to about 4,500 MPa/s, about 3,000 MPa/s to about 5,000 MPa/s, about 3,500 MPa/s to about 4,000 MPa/s, about 3,500 MPa/s to about 4,500 MPa/s, about 3,500 MPa/s to about 5,000 MPa/s, about 4,000 MPa/s to about 4,500 MPa/s, about 4,000 MPa/s to about 5,000 MPa/s, or about 4,500 MPa/s to about 5,000 MPa/s, including increments therein. In some embodiments, at least one of the breaking down of the agglomerates in the coating and the removing of the air bubbles from the coating is performed until the coating has a viscosity of about 1,000 MPa/s, about 1,500 MPa/s, about 2,000 MPa/s, about 2,500 MPa/s, about 3,000 MPa/s, about 3,500 MPa/s, about 4,000 MPa/s, about 4,500 MPa/s, or about 5,000 MPa/s. In some embodiments, at least one of the breaking down of the agglomerates in the coating and the removing of the air bubbles from the coating is performed until the coating has a viscosity of at least about 1,000 MPa/s, about 1,500 MPa/s, about 2,000 MPa/s, about 2,500 MPa/s, about 3,000 MPa/s, about 3,500 MPa/s, about 4,000 MPa/s, or about 4,500 MPa/s. In some embodiments, at least one of the breaking down of the agglomerates in the coating and the removing of the air bubbles from the coating is performed until the coating has a viscosity of at most about 1,500 MPa/s, about 2,000 MPa/s, about 2,500 MPa/s, about 3,000 MPa/s, about 3,500 MPa/s, about 4,000 MPa/s, about 4,500 MPa/s, or about 5,000 MPa/s.

In some embodiments, the coating has a viscosity of about 1,000 MPa/s to about 5,000 MPa/s. In some embodiments, the coating has a viscosity of about 1,000 MPa/s to about 1,500 MPa/s, about 1,000 MPa/s to about 2,000 MPa/s, about 1,000 MPa/s to about 2,500 MPa/s, about 1,000 MPa/s to about 3,000 MPa/s, about 1,000 MPa/s to about 3,500 MPa/s, about 1,000 MPa/s to about 4,000 MPa/s, about 1,000 MPa/s to about 4,500 MPa/s, about 1,000 MPa/s to about 5,000 MPa/s, about 1,500 MPa/s to about 2,000 MPa/s, about 1,500 MPa/s to about 2,500 MPa/s, about 1,500 MPa/s to about 3,000 MPa/s, about 1,500 MPa/s to about 3,500 MPa/s, about 1,500 MPa/s to about 4,000 MPa/s, about 1,500 MPa/s to about 4,500 MPa/s, about 1,500 MPa/s to about 5,000 MPa/s, about 2,000 MPa/s to about 2,500 MPa/s, about 2,000 MPa/s to about 3,000 MPa/s, about 2,000 MPa/s to about 3,500 MPa/s, about 2,000 MPa/s to about 4,000 MPa/s, about 2,000 MPa/s to about 4,500 MPa/s, about 2,000 MPa/s to about 5,000 MPa/s, about 2,500 MPa/s to about 3,000 MPa/s, about 2,500 MPa/s to about 3,500 MPa/s, about 2,500 MPa/s to about 4,000 MPa/s, about 2,500 MPa/s to about 4,500 MPa/s, about 2,500 MPa/s to about 5,000 MPa/s, about 3,000 MPa/s to about 3,500 MPa/s, about 3,000 MPa/s to about 4,000 MPa/s, about 3,000 MPa/s to about 4,500 MPa/s, about 3,000 MPa/s to about 5,000 MPa/s, about 3,500 MPa/s to about 4,000 MPa/s, about 3,500 MPa/s to about 4,500 MPa/s, about 3,500 MPa/s to about 5,000 MPa/s, about 4,000 MPa/s to about 4,500 MPa/s, about 4,000 MPa/s to about 5,000 MPa/s, or about 4,500 MPa/s to about 5,000 MPa/s, including increments therein. In some embodiments, the coating has a viscosity of about 1,000 MPa/s, about 1,500 MPa/s, about 2,000 MPa/s, about 2,500 MPa/s, about 3,000 MPa/s, about 3,500 MPa/s, about 4,000 MPa/s, about 4,500 MPa/s, or about 5,000 MPa/s. In some embodiments, the coating has a viscosity of at least about 1,000 MPa/s, about 1,500 MPa/s, about 2,000 MPa/s, about 2,500 MPa/s, about 3,000 MPa/s, about 3,500 MPa/s, about 4,000 MPa/s, or about 4,500 MPa/s. In some embodiments, the coating has a viscosity of at most about 1,500 MPa/s, about 2,000 MPa/s, about 2,500 MPa/s, about 3,000 MPa/s, about 3,500 MPa/s, about 4,000 MPa/s, about 4,500 MPa/s, or about 5,000 MPa/s.

EMI Shield Effectiveness Testing

Figure 6:
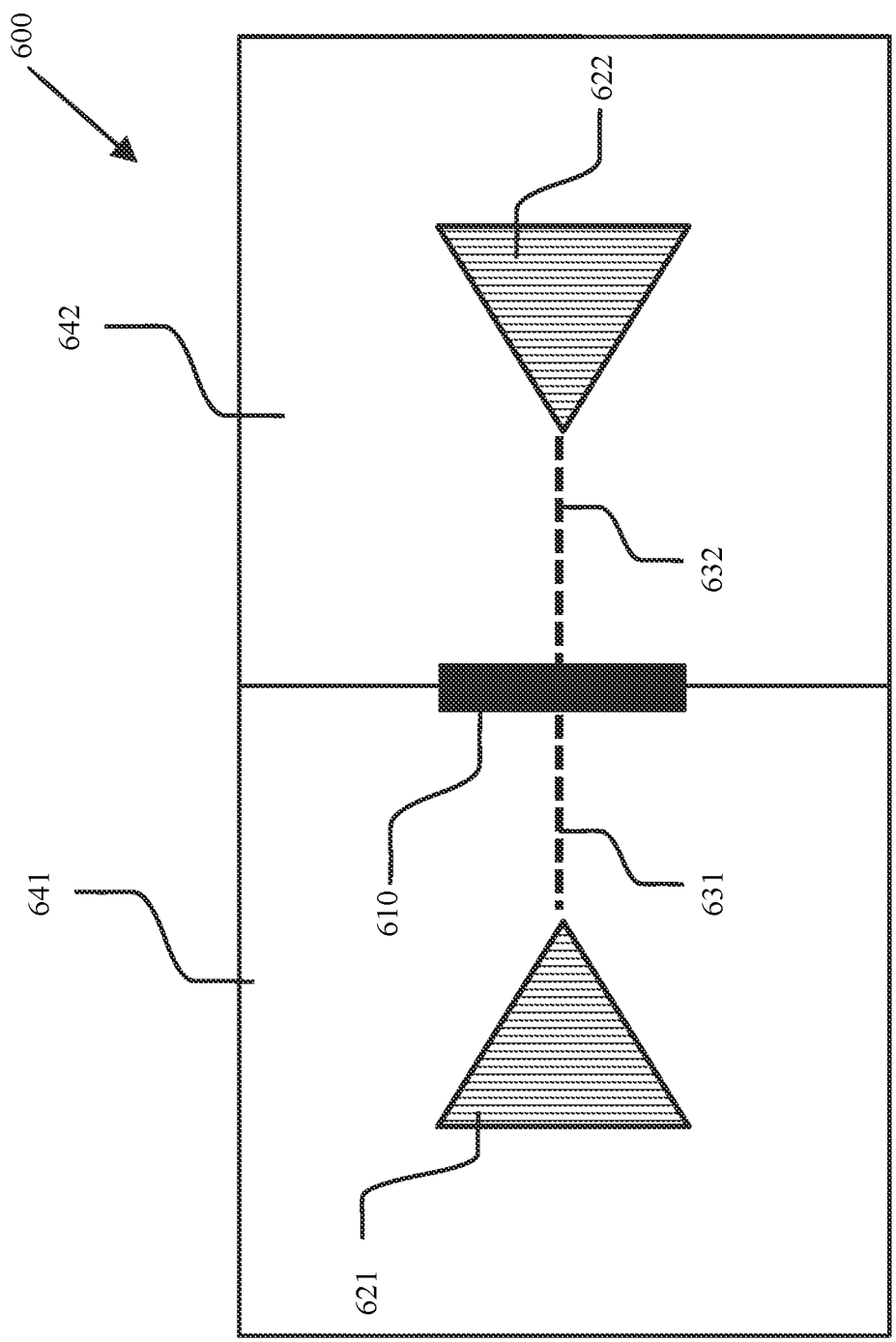
FIG. 6 shows a diagram of an EMI shield effectiveness testing setup.

Although various apparatuses or methods known to one of skill in the art can be employed to test the Electromagnetic Interference (EMI) shield effectiveness of a sample 610, FIG. 6 shows a diagram of an EMI shield effectiveness testing apparatus 600. As shown the apparatus 600 comprises a transmitting antenna 621 and a receiving antenna 622 that are separated by the EMI shielding sample 610. Further as shown, the transmitting antenna 621 emits an unattenuated signal 631, whereas the EMI shielding sample 610 blocks all but an attenuated signal 632 from reaching the receiving antenna 622. The shielding effectiveness of the EMI shielding sample 610 can be determined as the difference between the power of the unattenuated signal 631 and the attenuated signal 632.

In some embodiments, per FIG. 6, the transmitting antenna 621 is contained within a first shielded enclosure 641 and the receiving antenna 622 is contained with a second shielded enclosure 642. Alternatively, in some embodiments, only the transmitting antenna 621 is contained within the first shielded enclosure 641, whereas the receiving antenna 622 is not contained with the second shielded enclosure 642. Alternatively, in some embodiments, only the receiving antenna 622 is contained with the second shielded enclosure 642, wherein the transmitting antenna 621 is not contained within the first shielded enclosure 641.

In some embodiments, the transmitting antenna 621 receives the unattenuated signal 631 from a signal generator. In some embodiments, the transmitting antenna 621 receives the unattenuated signal 631 from a power amplifier receiving the unattenuated signal 631 from the signal generator. In some embodiments, the receiving antenna 622 transmits the attenuated signal 632 to a spectrum analyzer, a signal analyzer, or any combination thereof.

In some embodiments, the transmitting antenna 621 and the receiving antenna 622 are aligned such that the unattenuated signal 631 and the attenuated signal 632 are both perpendicular to the EMI shielding sample 610. In some embodiments, the transmitting antenna 621 and the receiving antenna 622 are aligned such that the unattenuated signal 631 and the attenuated signal 632 are emitted at the center of the EMI shielding sample 610. In some embodiments, the transmitting antenna 621 is separated from the EMI shielding sample 610 by about 50 cm. In some embodiments, the receiving antenna 622 is separated from the EMI shielding sample 610 by about 50 cm. In some embodiments, the transmitting antenna 621 and the receiving are separated from each other by about 100 cm.

FIGS. 7A-B shows images of a transmission portion of an EMI shield effectiveness testing setup. FIGS. 8A-B shows images of a reception portion of an EMI shield effectiveness testing setup.

EMI Shielding Performance

In some embodiments, the electromagnetic shield has a conductivity of about 10 S/m to about 10,000 S/m. In some embodiments, the electromagnetic shield has a conductivity of about 10 S/m to about 20 S/m, about 10 S/m to about 50 S/m, about 10 S/m to about 100 S/m, about 10 S/m to about 200 S/m, about 10 S/m to about 500 S/m, about 10 S/m to about 1,000 S/m, about 10 S/m to about 2,000 S/m, about 10 S/m to about 5,000 S/m, about 10 S/m to about 10,000 S/m, about 10 S/m to about 2,000 S/m, about 20 S/m to about 50 S/m, about 20 S/m to about 100 S/m, about 20 S/m to about 200 S/m, about 20 S/m to about 500 S/m, about 20 S/m to about 1,000 S/m, about 20 S/m to about 2,000 S/m, about 20 S/m to about 5,000 S/m, about 20 S/m to about 10,000 S/m, about 20 S/m to about 2,000 S/m, about 50 S/m to about 100 S/m, about 50 S/m to about 200 S/m, about 50 S/m to about 500 S/m, about 50 S/m to about 1,000 S/m, about 50 S/m to about 2,000 S/m, about 50 S/m to about 5,000 S/m, about 50 S/m to about 10,000 S/m, about 50 S/m to about 2,000 S/m, about 100 S/m to about 200 S/m, about 100 S/m to about 500 S/m, about 100 S/m to about 1,000 S/m, about 100 S/m to about 2,000 S/m, about 100 S/m to about 5,000 S/m, about 100 S/m to about 10,000 S/m, about 100 S/m to about 2,000 S/m, about 200 S/m to about 500 S/m, about 200 S/m to about 1,000 S/m, about 200 S/m to about 2,000 S/m, about 200 S/m to about 5,000 S/m, about 200 S/m to about 10,000 S/m, about 200 S/m to about 2,000 S/m, about 500 S/m to about 1,000 S/m, about 500 S/m to about 2,000 S/m, about 500 S/m to about 5,000 S/m, about 500 S/m to about 10,000 S/m, about 500 S/m to about 2,000 S/m, about 1,000 S/m to about 2,000 S/m, about 1,000 S/m to about 5,000 S/m, about 1,000 S/m to about 10,000 S/m, about 1,000 S/m to about 2,000 S/m, about 2,000 S/m to about 5,000 S/m, about 2,000 S/m to about 10,000 S/m, about 2,000 S/m to about 2,000 S/m, about 5,000 S/m to about 10,000 S/m, about 5,000 S/m to about 2,000 S/m, or about 10,000 S/m to about 2,000 S/m. In some embodiments, the electromagnetic shield has a conductivity of about 10 S/m, about 20 S/m, about 50 S/m, about 100 S/m, about 200 S/m, about 500 S/m, about 1,000 S/m, about 2,000 S/m, about 5,000 S/m, about 10,000 S/m, or about 2,000 S/m. In some embodiments, the electromagnetic shield has a conductivity of at least about 10 S/m, about 20 S/m, about 50 S/m, about 100 S/m, about 200 S/m, about 500 S/m, about 1,000 S/m, about 2,000 S/m, about 5,000 S/m, or about 10,000 S/m. In some embodiments, the electromagnetic shield has a conductivity of at most about 20 S/m, about 50 S/m, about 100 S/m, about 200 S/m, about 500 S/m, about 1,000 S/m, about 2,000 S/m, about 5,000 S/m, about 10,000 S/m, or about 2,000 S/m.

In some embodiments, the electromagnetic shield has a sheet resistance of about 0.1 ohm/sq to about 1,000 ohm/sq. In some embodiments, the electromagnetic shield has a sheet resistance of about 0.1 ohm/sq to about 0.2 ohm/sq, about 0.1 ohm/sq to about 0.5 ohm/sq, about 0.1 ohm/sq to about 1 ohm/sq, about 0.1 ohm/sq to about 5 ohm/sq, about 0.1 ohm/sq to about 10 ohm/sq, about 0.1 ohm/sq to about 50 ohm/sq, about 0.1 ohm/sq to about 100 ohm/sq, about 0.1 ohm/sq to about 500 ohm/sq, about 0.1 ohm/sq to about 1,000 ohm/sq, about 0.2 ohm/sq to about 0.5 ohm/sq, about 0.2 ohm/sq to about 1 ohm/sq, about 0.2 ohm/sq to about 5 ohm/sq, about 0.2 ohm/sq to about 10 ohm/sq, about 0.2 ohm/sq to about 50 ohm/sq, about 0.2 ohm/sq to about 100 ohm/sq, about 0.2 ohm/sq to about 500 ohm/sq, about 0.2 ohm/sq to about 1,000 ohm/sq, about 0.5 ohm/sq to about 1 ohm/sq, about 0.5 ohm/sq to about 5 ohm/sq, about 0.5 ohm/sq to about 10 ohm/sq, about 0.5 ohm/sq to about 50 ohm/sq, about 0.5 ohm/sq to about 100 ohm/sq, about 0.5 ohm/sq to about 500 ohm/sq, about 0.5 ohm/sq to about 1,000 ohm/sq, about 1 ohm/sq to about 5 ohm/sq, about 1 ohm/sq to about 10 ohm/sq, about 1 ohm/sq to about 50 ohm/sq, about 1 ohm/sq to about 100 ohm/sq, about 1 ohm/sq to about 500 ohm/sq, about 1 ohm/sq to about 1,000 ohm/sq, about 5 ohm/sq to about 10 ohm/sq, about 5 ohm/sq to about 50 ohm/sq, about 5 ohm/sq to about 100 ohm/sq, about 5 ohm/sq to about 500 ohm/sq, about 5 ohm/sq to about 1,000 ohm/sq, about 10 ohm/sq to about 50 ohm/sq, about 10 ohm/sq to about 100 ohm/sq, about 10 ohm/sq to about 500 ohm/sq, about 10 ohm/sq to about 1,000 ohm/sq, about 50 ohm/sq to about 100 ohm/sq, about 50 ohm/sq to about 500 ohm/sq, about 50 ohm/sq to about 1,000 ohm/sq, about 100 ohm/sq to about 500 ohm/sq, about 100 ohm/sq to about 1,000 ohm/sq, or about 500 ohm/sq to about 1,000 ohm/sq. In some embodiments, the electromagnetic shield has a sheet resistance of about 0.1 ohm/sq, about 0.2 ohm/sq, about 0.5 ohm/sq, about 1 ohm/sq, about 5 ohm/sq, about 10 ohm/sq, about 50 ohm/sq, about 100 ohm/sq, about 500 ohm/sq, or about 1,000 ohm/sq. In some embodiments, the electromagnetic shield has a sheet resistance of at least about 0.1 ohm/sq, about 0.2 ohm/sq, about 0.5 ohm/sq, about 1 ohm/sq, about 5 ohm/sq, about 10 ohm/sq, about 50 ohm/sq, about 100 ohm/sq, or about 500 ohm/sq. In some embodiments, the electromagnetic shield has a sheet resistance of at most about 0.2 ohm/sq, about 0.5 ohm/sq, about 1 ohm/sq, about 5 ohm/sq, about 10 ohm/sq, about 50 ohm/sq, about 100 ohm/sq, about 500 ohm/sq, or about 1,000 ohm/sq.

In some embodiments, the electromagnetic shield has an operating temperature of about 0° C. to about 400° C. In some embodiments, the electromagnetic shield has an operating temperature of about 0° C. to about 10° C., about 0° C. to about 20° C., about 0° C. to about 50° C., about 0° C. to about 100° C., about 0° C. to about 150° C., about 0° C. to about 200° C., about 0° C. to about 250° C., about 0° C. to about 300° C., about 0° C. to about 350° C., about 0° C. to about 400° C., about 10° C. to about 20° C., about 10° C. to about 50° C., about 10° C. to about 100° C., about 10° C. to about 150° C., about 10° C. to about 200° C., about 10° C. to about 250° C., about 10° C. to about 300° C., about 10° C. to about 350° C., about 10° C. to about 400° C., about 20° C. to about 50° C., about 20° C. to about 100° C., about 20° C. to about 150° C., about 20° C. to about 200° C., about 20° C. to about 250° C., about 20° C. to about 300° C., about 20° C. to about 350° C., about 20° C. to about 400° C., about 50° C. to about 100° C., about 50° C. to about 150° C., about 50° C. to about 200° C., about 50° C. to about 250° C., about 50° C. to about 300° C., about 50° C. to about 350° C., about 50° C. to about 400° C., about 100° C. to about 150° C., about 100° C. to about 200° C., about 100° C. to about 250° C., about 100° C. to about 300° C., about 100° C. to about 350° C., about 100° C. to about 400° C., about 150° C. to about 200° C., about 150° C. to about 250° C., about 150° C. to about 300° C., about 150° C. to about 350° C., about 150° C. to about 400° C., about 200° C. to about 250° C., about 200° C. to about 300° C., about 200° C. to about 350° C., about 200° C. to about 400° C., about 250° C. to about 300° C., about 250° C. to about 350° C., about 250° C. to about 400° C., about 300° C. to about 350° C., about 300° C. to about 400° C., or about 350° C. to about 400° C. In some embodiments, the electromagnetic shield has an operating temperature of about 0° C., about 10° C., about 20° C., about 50° C., about 100° C., about 150° C., about 200° C., about 250° C., about 300° C., about 350° C., or about 400° C. In some embodiments, the electromagnetic shield has an operating temperature of at least about 0° C., about 10° C., about 20° C., about 50° C., about 100° C., about 150° C., about 200° C., about 250° C., about 300° C., or about 350° C. In some embodiments, the electromagnetic shield has an operating temperature of at most about 10° C., about 20° C., about 50° C., about 100° C., about 150° C., about 200° C., about 250° C., about 300° C., about 350° C., or about 400° C.

In some embodiments, the electromagnetic shield with a film thickness of less than 100 µm has a shielding effectiveness in the frequency range of about 10 kHz to about 40 MHz of about 20 dB to about 40 dB. In some embodiments, the electromagnetic shield with a film thickness of less than 100 µm has a shielding effectiveness in the frequency range of about 10 kHz to about 40 MHz of about 20 dB to about 22 dB, about 20 dB to about 24 dB, about 20 dB to about 26 dB, about 20 dB to about 28 dB, about 20 dB to about 30 dB, about 20 dB to about 32 dB, about 20 dB to about 34 dB, about 20 dB to about 36 dB, about 20 dB to about 38 dB, about 20 dB to about 40 dB, about 22 dB to about 24 dB, about 22 dB to about 26 dB, about 22 dB to about 28 dB, about 22 dB to about 30 dB, about 22 dB to about 32 dB, about 22 dB to about 34 dB, about 22 dB to about 36 dB, about 22 dB to about 38 dB, about 22 dB to about 40 dB, about 24 dB to about 26 dB, about 24 dB to about 28 dB, about 24 dB to about 30 dB, about 24 dB to about 32 dB, about 24 dB to about 34 dB, about 24 dB to about 36 dB, about 24 dB to about 38 dB, about 24 dB to about 40 dB, about 26 dB to about 28 dB, about 26 dB to about 30 dB, about 26 dB to about 32 dB, about 26 dB to about 34 dB, about 26 dB to about 36 dB, about 26 dB to about 38 dB, about 26 dB to about 40 dB, about 28 dB to about 30 dB, about 28 dB to about 32 dB, about 28 dB to about 34 dB, about 28 dB to about 36 dB, about 28 dB to about 38 dB, about 28 dB to about 40 dB, about 30 dB to about 32 dB, about 30 dB to about 34 dB, about 30 dB to about 36 dB, about 30 dB to about 38 dB, about 30 dB to about 40 dB, about 32 dB to about 34 dB, about 32 dB to about 36 dB, about 32 dB to about 38 dB, about 32 dB to about 40 dB, about 34 dB to about 36 dB, about 34 dB to about 38 dB, about 34 dB to about 40 dB, about 36 dB to about 38 dB, about 36 dB to about 40 dB, or about 38 dB to about 40 dB. In some embodiments, the electromagnetic shield with a film thickness of less than 100 µm has a shielding effectiveness in the frequency range of about 10 kHz to about 40 MHz of about 20 dB, about 22 dB, about 24 dB, about 26 dB, about 28 dB, about 30 dB, about 32 dB, about 34 dB, about 36 dB, about 38 dB, or about 40 dB. In some embodiments, the electromagnetic shield with a film thickness of less than 100 µm has a shielding effectiveness in the frequency range of about 10 kHz to about 40 MHz of at least about 20 dB, about 22 dB, about 24 dB, about 26 dB, about 28 dB, about 30 dB, about 32 dB, about 34 dB, about 36 dB, or about 38 dB. In some embodiments, the electromagnetic shield with a film thickness of less than 100 µm has a shielding effectiveness in the frequency range of about 10 kHz to about 40 MHz of at most about 22 dB, about 24 dB, about 26 dB, about 28 dB, about 30 dB, about 32 dB, about 34 dB, about 36 dB, about 38 dB, or about 40 dB.

In some embodiments, the electromagnetic shield with a film thickness of less than 100 µm has a shielding effectiveness in the frequency range of about of about 1 GHz to about 40 GHz of about 40 dB to about 70 dB. In some embodiments, the electromagnetic shield with a film thickness of less than 100 µm has a shielding effectiveness in the frequency range of about of about 1 GHz to about 40 GHz of about 40 dB to about 45 dB, about 40 dB to about 50 dB, about 40 dB to about 55 dB, about 40 dB to about 60 dB, about 40 dB to about 65 dB, about 40 dB to about 70 dB, about 45 dB to about 50 dB, about 45 dB to about 55 dB, about 45 dB to about 60 dB, about 45 dB to about 65 dB, about 45 dB to about 70 dB, about 50 dB to about 55 dB, about 50 dB to about 60 dB, about 50 dB to about 65 dB, about 50 dB to about 70 dB, about 55 dB to about 60 dB, about 55 dB to about 65 dB, about 55 dB to about 70 dB, about 60 dB to about 65 dB, about 60 dB to about 70 dB, or about 65 dB to about 70 dB. In some embodiments, the electromagnetic shield with a film thickness of less than 100 µm has a shielding effectiveness in the frequency range of about of about 1 GHz to about 40 GHz of about 40 dB, about 45 dB, about 50 dB, about 55 dB, about 60 dB, about 65 dB, or about 70 dB. In some embodiments, the electromagnetic shield with a film thickness of less than 100 µm has a shielding effectiveness in the frequency range of about of about 1 GHz to about 40 GHz of at least about 40 dB, about 45 dB, about 50 dB, about 55 dB, about 60 dB, or about 65 dB. In some embodiments, the electromagnetic shield with a film thickness of less than 100 µm has a shielding effectiveness in the frequency range of about of about 1 GHz to about 40 GHz of at most about 45 dB, about 50 dB, about 55 dB, about 60 dB, about 65 dB, or about 70 dB.

In some embodiments, the electromagnetic shield with a film thickness of less than 100 µm has a shielding effectiveness in the frequency range of about of 10 kHz to about 30 kHz of about 5 dB to about 40 dB. In some embodiments, the electromagnetic shield with a film thickness of less than 100 µm has a shielding effectiveness in the frequency range of about of 10 kHz to about 30 kHz of about 5 dB to about 10 dB, about 5 dB to about 15 dB, about 5 dB to about 20 dB, about 5 dB to about 25 dB, about 5 dB to about 30 dB, about 5 dB to about 35 dB, about 5 dB to about 40 dB, about 10 dB to about 15 dB, about 10 dB to about 20 dB, about 10 dB to about 25 dB, about 10 dB to about 30 dB, about 10 dB to about 35 dB, about 10 dB to about 40 dB, about 15 dB to about 20 dB, about 15 dB to about 25 dB, about 15 dB to about 30 dB, about 15 dB to about 35 dB, about 15 dB to about 40 dB, about 20 dB to about 25 dB, about 20 dB to about 30 dB, about 20 dB to about 35 dB, about 20 dB to about 40 dB, about 25 dB to about 30 dB, about 25 dB to about 35 dB, about 25 dB to about 40 dB, about 30 dB to about 35 dB, about 30 dB to about 40 dB, or about 35 dB to about 40 dB. In some embodiments, the electromagnetic shield with a film thickness of less than 100 µm has a shielding effectiveness in the frequency range of about of 10 kHz to about 30 kHz of about 5 dB, about 10 dB, about 15 dB, about 20 dB, about 25 dB, about 30 dB, about 35 dB, or about 40 dB. In some embodiments, the electromagnetic shield with a film thickness of less than 100 µm has a shielding effectiveness in the frequency range of about of 10 kHz to about 30 kHz of at least about 5 dB, about 10 dB, about 15 dB, about 20 dB, about 25 dB, about 30 dB, or about 35 dB. In some embodiments, the electromagnetic shield with a film thickness of less than 100 µm has a shielding effectiveness in the frequency range of about of 10 kHz to about 30 kHz of at most about 10 dB, about 15 dB, about 20 dB, about 25 dB, about 30 dB, about 35 dB, or about 40 dB.

In some embodiments, the electromagnetic shield with a film thickness of less than 100 µm has a shielding effectiveness in the frequency range of about of about 40 kHz to about 100 MHz of about 1 dB to about 100 dB. In some embodiments, the electromagnetic shield with a film thickness of less than 100 µm has a shielding effectiveness in the frequency range of about of about 40 kHz to about 100 MHz of about 1 dB to about 5 dB, about 1 dB to about 10 dB, about 1 dB to about 20 dB, about 1 dB to about 30 dB, about 1 dB to about 40 dB, about 1 dB to about 50 dB, about 1 dB to about 60 dB, about 1 dB to about 70 dB, about 1 dB to about 80 dB, about 1 dB to about 90 dB, about 1 dB to about 100 dB, about 5 dB to about 10 dB, about 5 dB to about 20 dB, about 5 dB to about 30 dB, about 5 dB to about 40 dB, about 5 dB to about 50 dB, about 5 dB to about 60 dB, about 5 dB to about 70 dB, about 5 dB to about 80 dB, about 5 dB to about 90 dB, about 5 dB to about 100 dB, about 10 dB to about 20 dB, about 10 dB to about 30 dB, about 10 dB to about 40 dB, about 10 dB to about 50 dB, about 10 dB to about 60 dB, about 10 dB to about 70 dB, about 10 dB to about 80 dB, about 10 dB to about 90 dB, about 10 dB to about 100 dB, about 20 dB to about 30 dB, about 20 dB to about 40 dB, about 20 dB to about 50 dB, about 20 dB to about 60 dB, about 20 dB to about 70 dB, about 20 dB to about 80 dB, about 20 dB to about 90 dB, about 20 dB to about 100 dB, about 30 dB to about 40 dB, about 30 dB to about 50 dB, about 30 dB to about 60 dB, about 30 dB to about 70 dB, about 30 dB to about 80 dB, about 30 dB to about 90 dB, about 30 dB to about 100 dB, about 40 dB to about 50 dB, about 40 dB to about 60 dB, about 40 dB to about 70 dB, about 40 dB to about 80 dB, about 40 dB to about 90 dB, about 40 dB to about 100 dB, about 50 dB to about 60 dB, about 50 dB to about 70 dB, about 50 dB to about 80 dB, about 50 dB to about 90 dB, about 50 dB to about 100 dB, about 60 dB to about 70 dB, about 60 dB to about 80 dB, about 60 dB to about 90 dB, about 60 dB to about 100 dB, about 70 dB to about 80 dB, about 70 dB to about 90 dB, about 70 dB to about 100 dB, about 80 dB to about 90 dB, about 80 dB to about 100 dB, or about 90 dB to about 100 dB. In some embodiments, the electromagnetic shield with a film thickness of less than 100 μm has a shielding effectiveness in the frequency range of about of about 40 kHz to about 100 MHz of about 1 dB, about 5 dB, about 10 dB, about 20 dB, about 30 dB, about 40 dB, about 50 dB, about 60 dB, about 70 dB, about 80 dB, about 90 dB, or about 100 dB. In some embodiments, the electromagnetic shield with a film thickness of less than 100 μm has a shielding effectiveness in the frequency range of about of about 40 kHz to about 100 MHz of at least about 1 dB, about 5 dB, about 10 dB, about 20 dB, about 30 dB, about 40 dB, about 50 dB, about 60 dB, about 70 dB, about 80 dB, or about 90 dB. In some embodiments, the electromagnetic shield with a film thickness of less than 100 μm has a shielding effectiveness in the frequency range of about of about 40 kHz to about 100 MHz of at most about 5 dB, about 10 dB, about 20 dB, about 30 dB, about 40 dB, about 50 dB, about 60 dB, about 70 dB, about 80 dB, about 90 dB, or about 100 dB.

In some embodiments, the electromagnetic shield with a film thickness of less than 100 μm has a shielding effectiveness in the frequency range of about of 200 MHz to about 1 GHz of about 1 dB to about 100 dB. In some embodiments, the electromagnetic shield with a film thickness of less than 100 μm has a shielding effectiveness in the frequency range of about of 200 MHz to about 1 GHz of about 1 dB to about 5 dB, about 1 dB to about 10 dB, about 1 dB to about 20 dB, about 1 dB to about 30 dB, about 1 dB to about 40 dB, about 1 dB to about 50 dB, about 1 dB to about 60 dB, about 1 dB to about 70 dB, about 1 dB to about 80 dB, about 1 dB to about 90 dB, about 1 dB to about 100 dB, about 5 dB to about 10 dB, about 5 dB to about 20 dB, about 5 dB to about 30 dB, about 5 dB to about 40 dB, about 5 dB to about 50 dB, about 5 dB to about 60 dB, about 5 dB to about 70 dB, about 5 dB to about 80 dB, about 5 dB to about 90 dB, about 5 dB to about 100 dB, about 10 dB to about 20 dB, about 10 dB to about 30 dB, about 10 dB to about 40 dB, about 10 dB to about 50 dB, about 10 dB to about 60 dB, about 10 dB to about 70 dB, about 10 dB to about 80 dB, about 10 dB to about 90 dB, about 10 dB to about 100 dB, about 20 dB to about 30 dB, about 20 dB to about 40 dB, about 20 dB to about 50 dB, about 20 dB to about 60 dB, about 20 dB to about 70 dB, about 20 dB to about 80 dB, about 20 dB to about 90 dB, about 20 dB to about 100 dB, about 30 dB to about 40 dB, about 30 dB to about 50 dB, about 30 dB to about 60 dB, about 30 dB to about 70 dB, about 30 dB to about 80 dB, about 30 dB to about 90 dB, about 30 dB to about 100 dB, about 40 dB to about 50 dB, about 40 dB to about 60 dB, about 40 dB to about 70 dB, about 40 dB to about 80 dB, about 40 dB to about 90 dB, about 40 dB to about 100 dB, about 50 dB to about 60 dB, about 50 dB to about 70 dB, about 50 dB to about 80 dB, about 50 dB to about 90 dB, about 50 dB to about 100 dB, about 60 dB to about 70 dB, about 60 dB to about 80 dB, about 60 dB to about 90 dB, about 60 dB to about 100 dB, about 70 dB to about 80 dB, about 70 dB to about 90 dB, about 70 dB to about 100 dB, about 80 dB to about 90 dB, about 80 dB to about 100 dB, or about 90 dB to about 100 dB. In some embodiments, the electromagnetic shield with a film thickness of less than 100 μm has a shielding effectiveness in the frequency range of about of 200 MHz to about 1 GHz of about 1 dB, about 5 dB, about 10 dB, about 20 dB, about 30 dB, about 40 dB, about 50 dB, about 60 dB, about 70 dB, about 80 dB, about 90 dB, or about 100 dB. In some embodiments, the electromagnetic shield with a film thickness of less than 100 μm has a shielding effectiveness in the frequency range of about of 200 MHz to about 1 GHz of at least about 1 dB, about 5 dB, about 10 dB, about 20 dB, about 30 dB, about 40 dB, about 50 dB, about 60 dB, about 70 dB, about 80 dB, or about 90 dB. In some embodiments, the electromagnetic shield with a film thickness of less than 100 μm has a shielding effectiveness in the frequency range of about of 200 MHz to about 1 GHz of at most about 5 dB, about 10 dB, about 20 dB, about 30 dB, about 40 dB, about 50 dB, about 60 dB, about 70 dB, about 80 dB, about 90 dB, or about 100 dB.

In some embodiments, the electromagnetic shield with a film thickness of less than 100 μm has a shielding effectiveness in the frequency range of about 2 GHz to about 18 GHz of about 1 dB to about 120 dB. In some embodiments, the electromagnetic shield with a film thickness of less than 100 μm has a shielding effectiveness in the frequency range of about 2 GHz to about 18 GHz of about 1 dB to about 5 dB, about 1 dB to about 10 dB, about 1 dB to about 20 dB, about 1 dB to about 30 dB, about 1 dB to about 40 dB, about 1 dB to about 50 dB, about 1 dB to about 60 dB, about 1 dB to about 70 dB, about 1 dB to about 80 dB, about 1 dB to about 100 dB, about 1 dB to about 120 dB, about 5 dB to about 10 dB, about 5 dB to about 20 dB, about 5 dB to about 30 dB, about 5 dB to about 40 dB, about 5 dB to about 50 dB, about 5 dB to about 60 dB, about 5 dB to about 70 dB, about 5 dB to about 80 dB, about 5 dB to about 100 dB, about 5 dB to about 120 dB, about 10 dB to about 20 dB, about 10 dB to about 30 dB, about 10 dB to about 40 dB, about 10 dB to about 50 dB, about 10 dB to about 60 dB, about 10 dB to about 70 dB, about 10 dB to about 80 dB, about 10 dB to about 100 dB, about 10 dB to about 120 dB, about 20 dB to about 30 dB, about 20 dB to about 40 dB, about 20 dB to about 50 dB, about 20 dB to about 60 dB, about 20 dB to about 70 dB, about 20 dB to about 80 dB, about 20 dB to about 100 dB, about 20 dB to about 120 dB, about 30 dB to about 40 dB, about 30 dB to about 50 dB, about 30 dB to about 60 dB, about 30 dB to about 70 dB, about 30 dB to about 80 dB, about 30 dB to about 100 dB, about 30 dB to about 120 dB, about 40 dB to about 50 dB, about 40 dB to about 60 dB, about 40 dB to about 70 dB, about 40 dB to about 80 dB, about 40 dB to about 100 dB, about 40 dB to about 120 dB, about 50 dB to about 60 dB, about 50 dB to about 70 dB, about 50 dB to about 80 dB, about 50 dB to about 100 dB, about 50 dB to about 120 dB, about 60 dB to about 70 dB, about 60 dB to about 80 dB, about 60 dB to about 100 dB, about 60 dB to about 120 dB, about 70 dB to about 80 dB, about 70 dB to about 100 dB, about 70 dB to about 120 dB, about 80 dB to about 100 dB, about 80 dB to about 120 dB, or about 100 dB to about 120 dB. In some embodiments, the electromagnetic shield with a film thickness of less than 100 μm has a shielding effectiveness in the frequency range of about 2 GHz to about 18 GHz of about 1 dB, about 5 dB, about 10 dB, about 20 dB, about 30 dB, about 40 dB, about 50 dB, about 60 dB, about 70 dB, about 80 dB, about 100 dB, or about 120 dB. In some embodiments, the electromagnetic shield with a film thickness of less than 100 μm has a shielding effectiveness in the frequency range of about 2 GHz to about 18 GHz of at least about 1 dB, about 5 dB, about 10 dB, about 20 dB, about 30 dB, about 40 dB, about 50 dB, about 60 dB, about 70 dB, about 80 dB, or about 100 dB. In some embodiments, the electromagnetic shield with a film thickness of less than 100 μm has a shielding effectiveness in the frequency range of about 2 GHz to about 18 GHz of at most about 5 dB, about 10 dB, about 20 dB, about 30 dB, about 40 dB, about 50 dB, about 60 dB, about 70 dB, about 80 dB, about 100 dB, or about 120 dB.

In some embodiments, the electromagnetic shield with a film thickness of less than 100 μm has a shielding effectiveness in the frequency range of about 18 GHz to about 40 GHz of about 1 dB to about 120 dB. In some embodiments, the electromagnetic shield with a film thickness of less than 100 μm has a shielding effectiveness in the frequency range of about 18 GHz to about 40 GHz of about 1 dB to about 5 dB, about 1 dB to about 10 dB, about 1 dB to about 20 dB, about 1 dB to about 30 dB, about 1 dB to about 40 dB, about 1 dB to about 50 dB, about 1 dB to about 60 dB, about 1 dB to about 70 dB, about 1 dB to about 80 dB, about 1 dB to about 100 dB, about 1 dB to about 120 dB, about 5 dB to about 10 dB, about 5 dB to about 20 dB, about 5 dB to about 30 dB, about 5 dB to about 40 dB, about 5 dB to about 50 dB, about 5 dB to about 60 dB, about 5 dB to about 70 dB, about 5 dB to about 80 dB, about 5 dB to about 100 dB, about 5 dB to about 120 dB, about 10 dB to about 20 dB, about 10 dB to about 30 dB, about 10 dB to about 40 dB, about 10 dB to about 50 dB, about 10 dB to about 60 dB, about 10 dB to about 70 dB, about 10 dB to about 80 dB, about 10 dB to about 100 dB, about 10 dB to about 120 dB, about 20 dB to about 30 dB, about 20 dB to about 40 dB, about 20 dB to about 50 dB, about 20 dB to about 60 dB, about 20 dB to about 70 dB, about 20 dB to about 80 dB, about 20 dB to about 100 dB, about 20 dB to about 120 dB, about 30 dB to about 40 dB, about 30 dB to about 50 dB, about 30 dB to about 60 dB, about 30 dB to about 70 dB, about 30 dB to about 80 dB, about 30 dB to about 100 dB, about 30 dB to about 120 dB, about 40 dB to about 50 dB, about 40 dB to about 60 dB, about 40 dB to about 70 dB, about 40 dB to about 80 dB, about 40 dB to about 100 dB, about 40 dB to about 120 dB, about 50 dB to about 60 dB, about 50 dB to about 70 dB, about 50 dB to about 80 dB, about 50 dB to about 100 dB, about 50 dB to about 120 dB, about 60 dB to about 70 dB, about 60 dB to about 80 dB, about 60 dB to about 100 dB, about 60 dB to about 120 dB, about 70 dB to about 80 dB, about 70 dB to about 100 dB, about 70 dB to about 120 dB, about 80 dB to about 100 dB, about 80 dB to about 120 dB, or about 100 dB to about 120 dB. In some embodiments, the electromagnetic shield with a film thickness of less than 100 μm has a shielding effectiveness in the frequency range of about 18 GHz to about 40 GHz of about 1 dB, about 5 dB, about 10 dB, about 20 dB, about 30 dB, about 40 dB, about 50 dB, about 60 dB, about 70 dB, about 80 dB, about 100 dB, or about 120 dB. In some embodiments, the electromagnetic shield with a film thickness of less than 100 μm has a shielding effectiveness in the frequency range of about 18 GHz to about 40 GHz of at least about 1 dB, about 5 dB, about 10 dB, about 20 dB, about 30 dB, about 40 dB, about 50 dB, about 60 dB, about 70 dB, about 80 dB, or about 100 dB. In some embodiments, the electromagnetic shield with a film thickness of less than 100 μm has a shielding effectiveness in the frequency range of about 18 GHz to about 40 GHz of at most about 5 dB, about 10 dB, about 20 dB, about 30 dB, about 40 dB, about 50 dB, about 60 dB, about 70 dB, about 80 dB, about 100 dB, or about 120 dB.

Terms and Definitions

Unless otherwise defined, all technical terms used herein have the same meaning as commonly understood by one of ordinary skill in the art to which this disclosure belongs.

As used herein, the singular forms "a," "an," and "the" include plural references unless the context clearly dictates otherwise. Any reference to "or" herein is intended to encompass "and/or" unless otherwise stated.

As used herein, the term "about" refers to an amount that is near the stated amount by 10%, 5%, or 1%, including increments therein.

As used herein, the term "about" in reference to a percentage refers to an amount that is greater or less the stated percentage by 10%, 5%, or 1%, including increments therein.

As used herein, the phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means "A alone, B alone, C alone, A and B together, A and C together, B and C together, or A, B and C together".

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure.

EXAMPLES

Example 1—EMI Shields

First, second, third, fourth, and fifth electromagnetic shielding samples were created per Table 1 below and tested for shielding effectiveness using the apparatus described herein.

TABLE 1

| Shielding Sample | First | Second | Third | Fourth | Fifth | Sixth |
|---|---|---|---|---|---|---|
| Graphite (%) | 85-95 | 80-90 | 80-90 | 0 | 0 | 30-40 |
| $C_{45}$ (%) | 1-5 | 1-5 | 1-5 | 0 | 0 | 0 |
| rGO (%) | 0 | 2-6 | 2-6 | 15-25 | 5-10 | 0.5-2 |
| Carbon fiber (%) | 0 | 1-3 | 1-3 | 1-3 | 0 | 1-6 |
| CNT (%) | 0 | 1-3 | 1-4 | 10-15 | 5-10 | 2-6 |
| Binder (%) | 2-6 | 2-6 | 2-6 | 60-70 | 85-95 | 85-95 |
| Solvent | Water | Water | Water | NMP | NMP | PU |
| Sheet resistance (Ω/sq) | 2.5 | — | 1.5 | 28 | 2600 | 2600 |
| Conductivity (S/m) | 700 | — | 660 | 300 | 15 | 15 |
| Shielding effectiveness @ 10 kHz to 30 kHz (dB) | 13-23 | — | 12-22 | 10-22 | 10-22 | 10-22 |
| Shielding effectiveness @ 40 kHz to 100 MHz (dB) | 0-48 | — | 0-48 | 0-49 | 0-44 | 0-44 |
| Shielding effectiveness @ 200 MHz to 1 GHz (dB) | 20-45 | — | 18-46 | 9-31 | 0-2 | 0-2 |
| Shielding effectiveness @ 2 GHz to 18 GHz (dB) | 42-58 | — | 39-65 | 23-32 | 0-2 | 0-2 |
| Shielding effectiveness @ 18 GHz to 40 GHz (dB) | 54-67 | — | 60-71 | 30-45 | 0-5 | 0-5 |

Figure 3A:
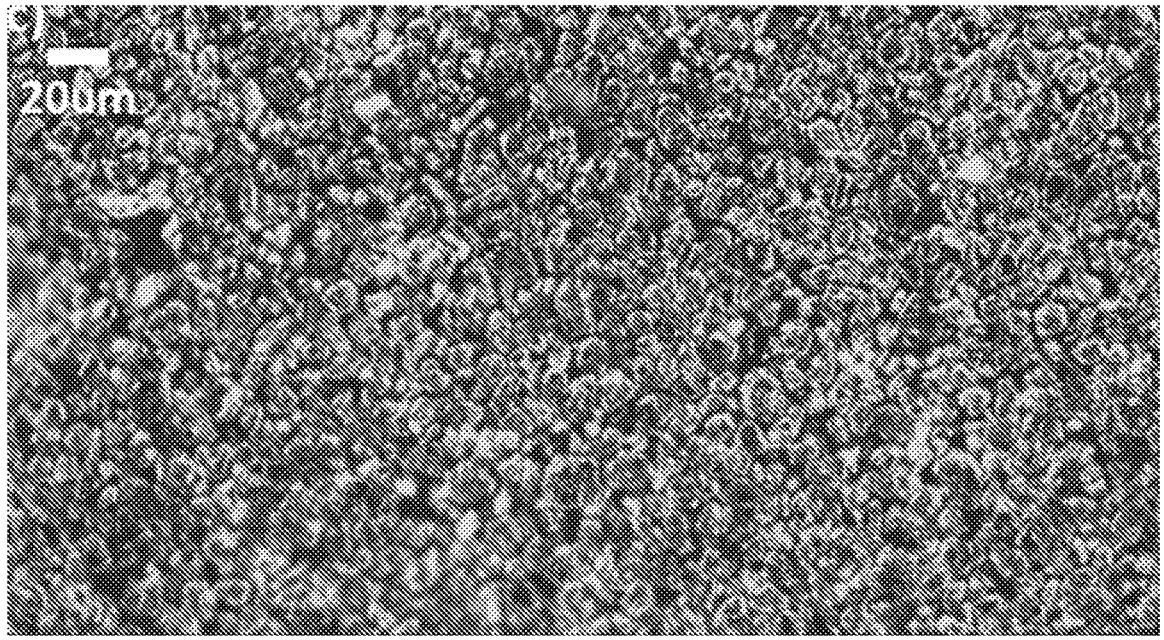
FIG. 3A shows a low magnification microscopy image of a first EMI shield according to a non-limiting embodiment.
Figure 3B:
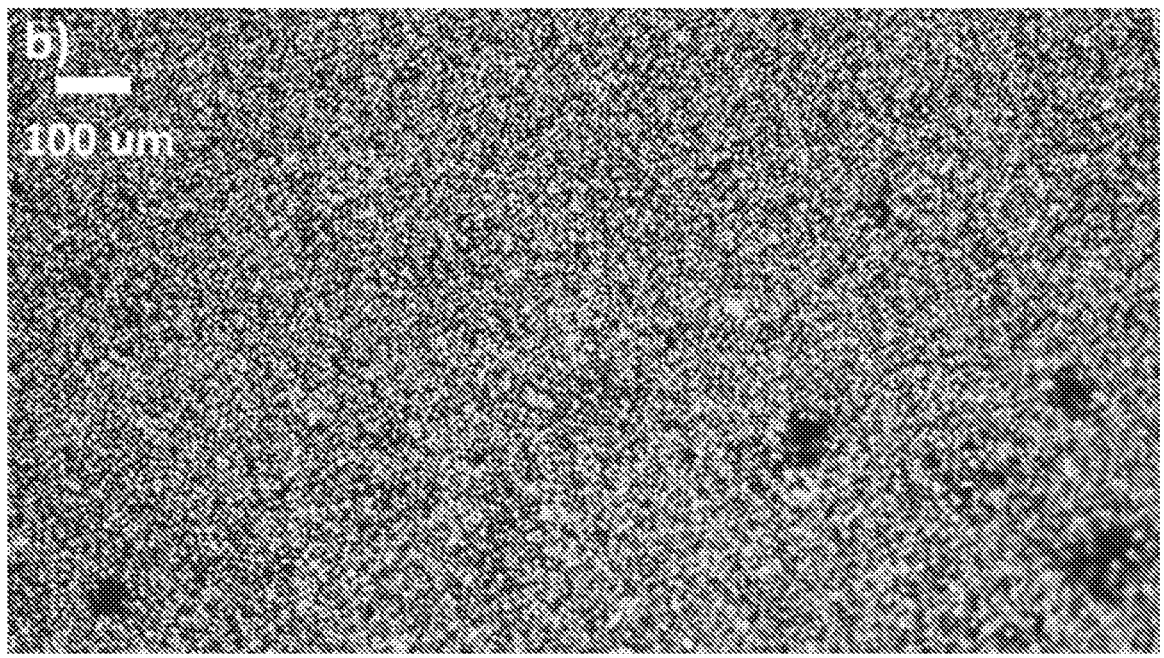
FIG. 3B shows a high magnification microscopy image of a first EMI shield according to a non-limiting embodiment.
Figure 4A:
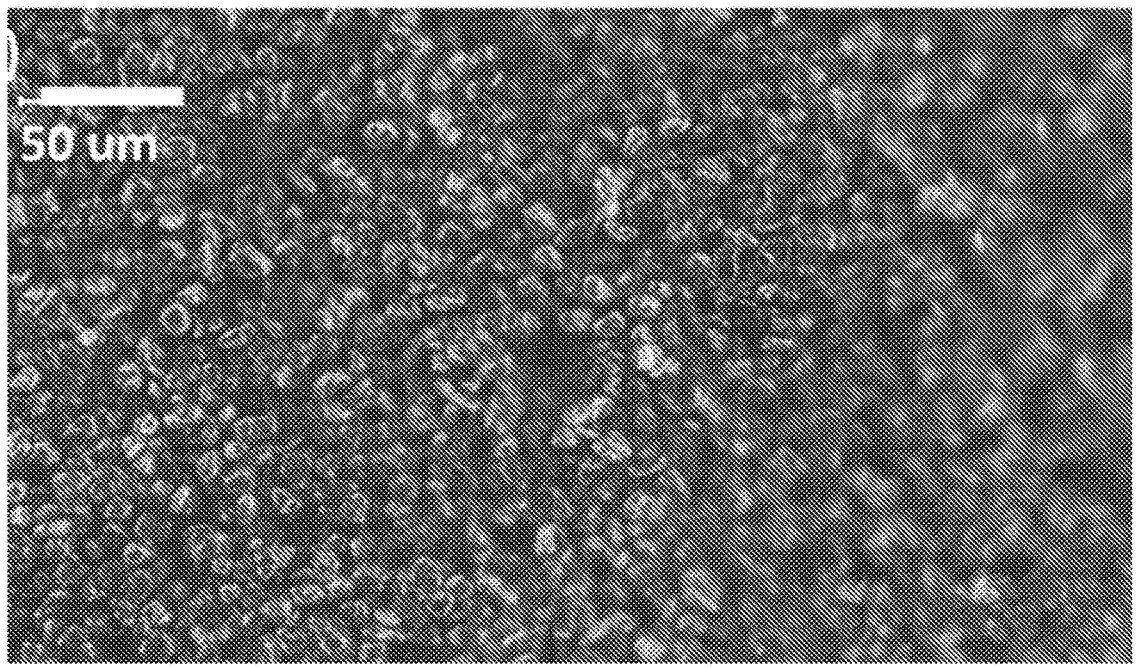
FIG. 4A shows a low magnification microscopy image of a third EMI shield according to a non-limiting embodiment.
Figure 4B:
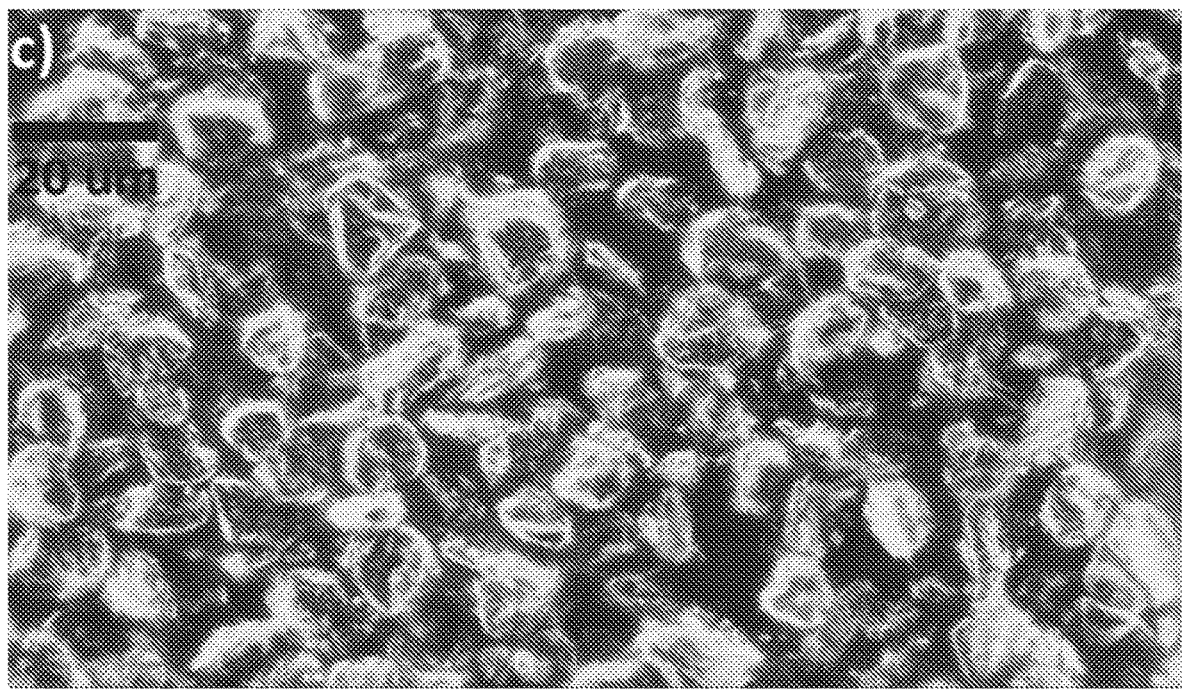
FIG. 4B shows a high magnification microscopy image of a third EMI shield according to a non-limiting embodiment.
Figure 5A:
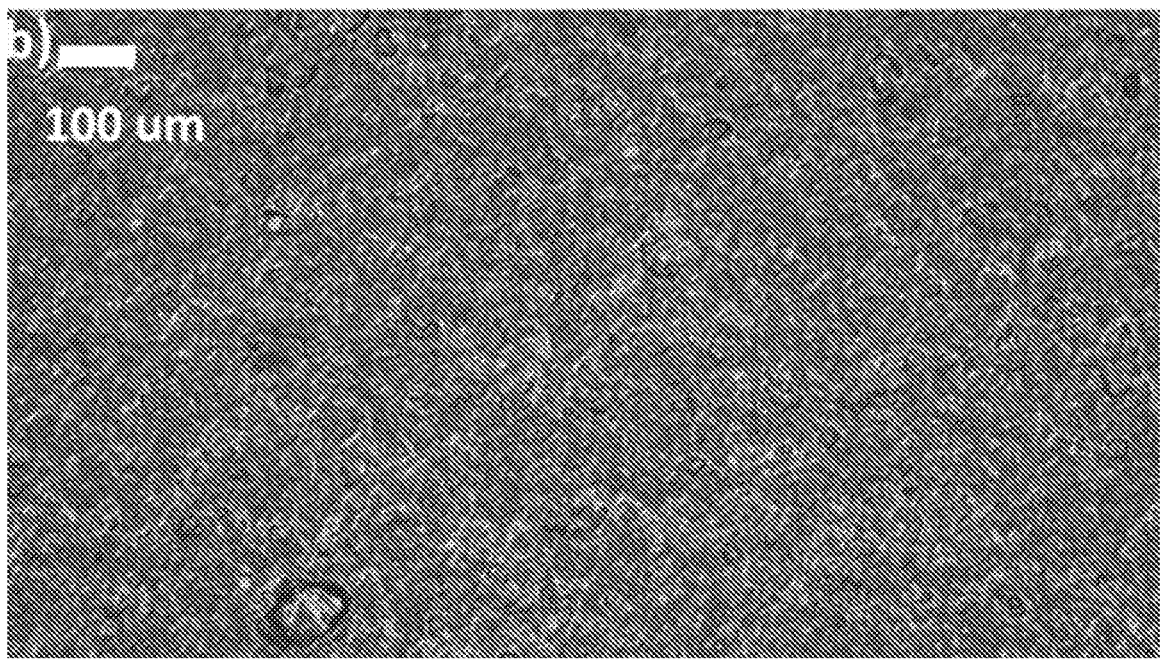
FIG. 5A shows a low magnification microscopy image of a fourth EMI shield according to a non-limiting embodiment.
Figure 5B:
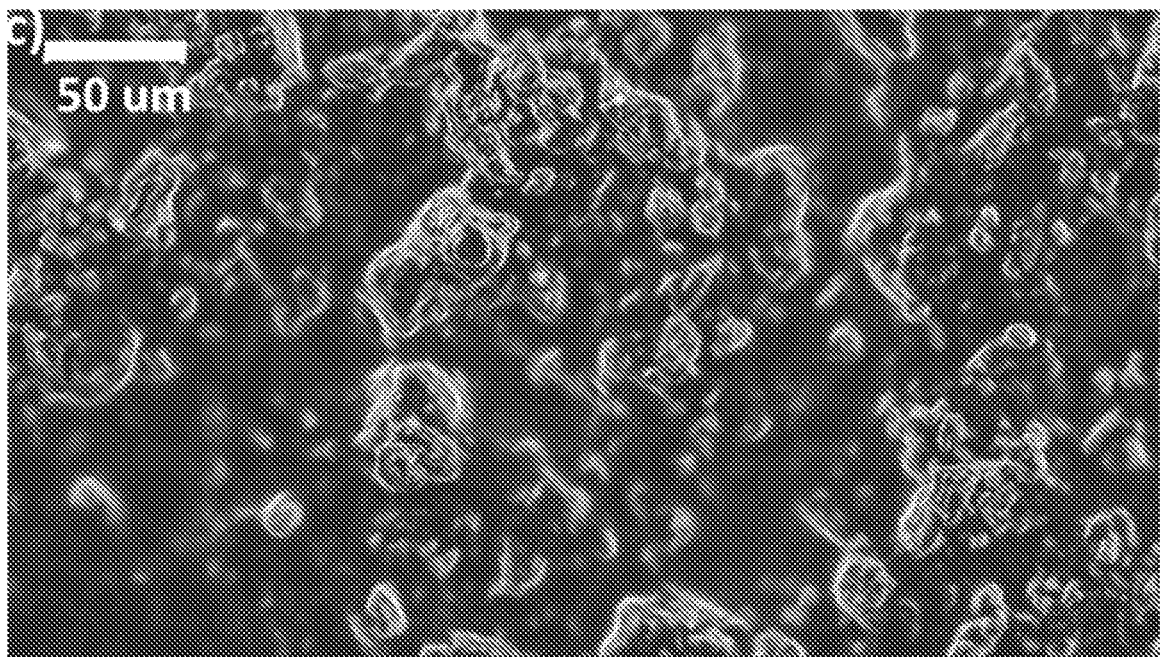
FIG. 5B shows a high magnification microscopy image of a fourth EMI shield according to a non-limiting embodiment.

FIGS. 3A-3B show microscopy images of the first EMI shield with a scale of 20 μm and 100 μm, respectively. FIGS. 4A-4B show microscopy images of the third EMI shield with a scale of 50 μm and 20 μm, respectively. FIGS. 5A-5B show microscopy images of the fourth EMI shield with a scale of 100 μm and 50 μm, respectively.

FIG. 7 shows a table of sixth to thirty-first EMI shielding samples. As shown, therein, some samples comprise reduced graphene oxide (rGO), wherein other samples comprise graphene oxide (GO), some samples comprise carbon nanotubes (CNT), whereas other samples comprise functionalized carbon nanotubes (CNT OH), some samples comprise a polyvinylidene fluoride (PVDF) binder, whereas other samples comprise a binder of carboxymethyl cellulose (CMC) and styrene butadiene rubber (SBR), some samples comprise a solvent comprising water, whereas other samples comprise a solvent comprising N-methyl-2-pyrrolidone, some samples comprise a substrate of glass, whereas other samples comprise a substrate formed of polyethylene terephthalate (PET) or copper (Cu).

Figure 8:
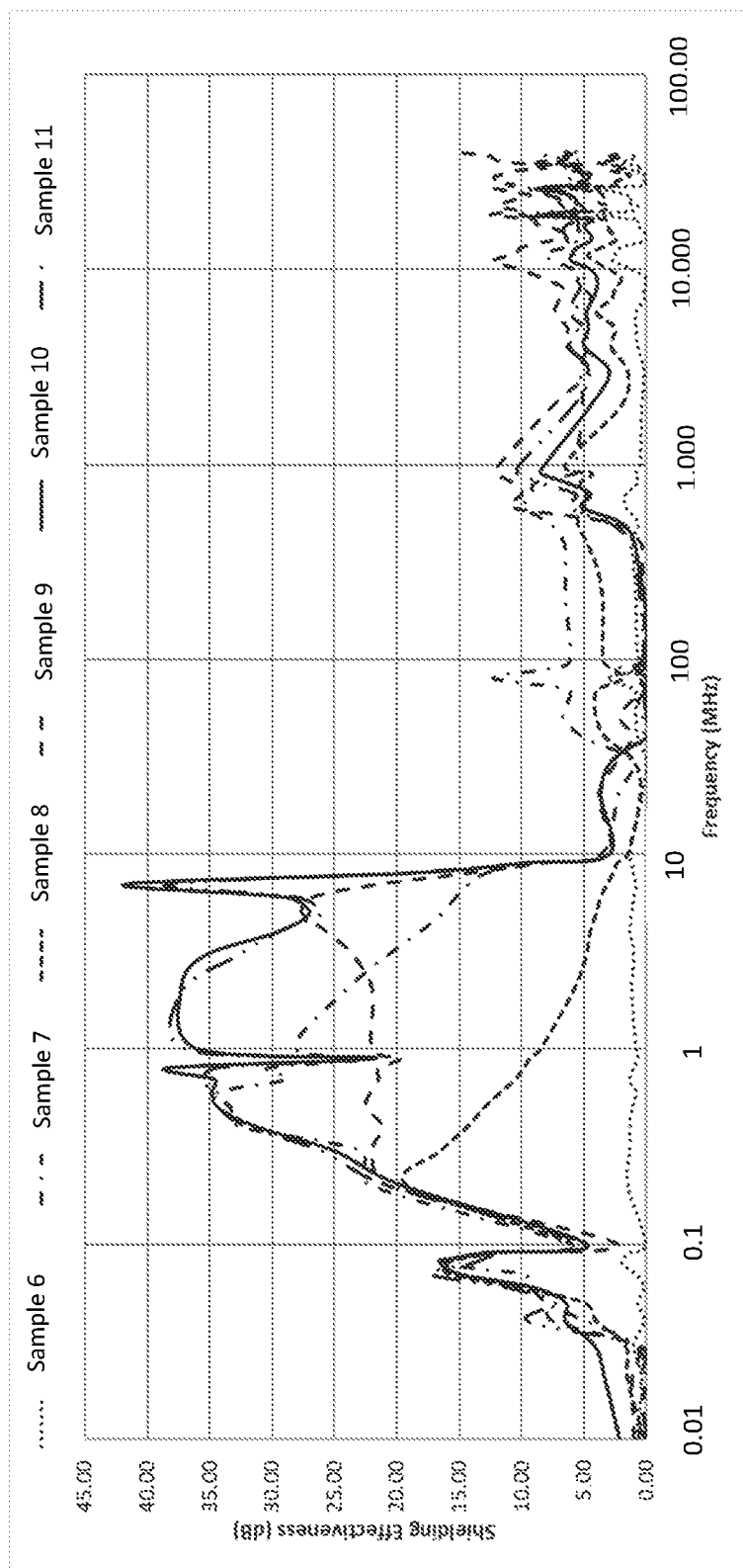
FIG. 8 shows a graph of shielding effectiveness in decibels verses an emitted test frequency in megahertz (MHz) for sixth to eleventh EMI filtering samples.
Figure 9:
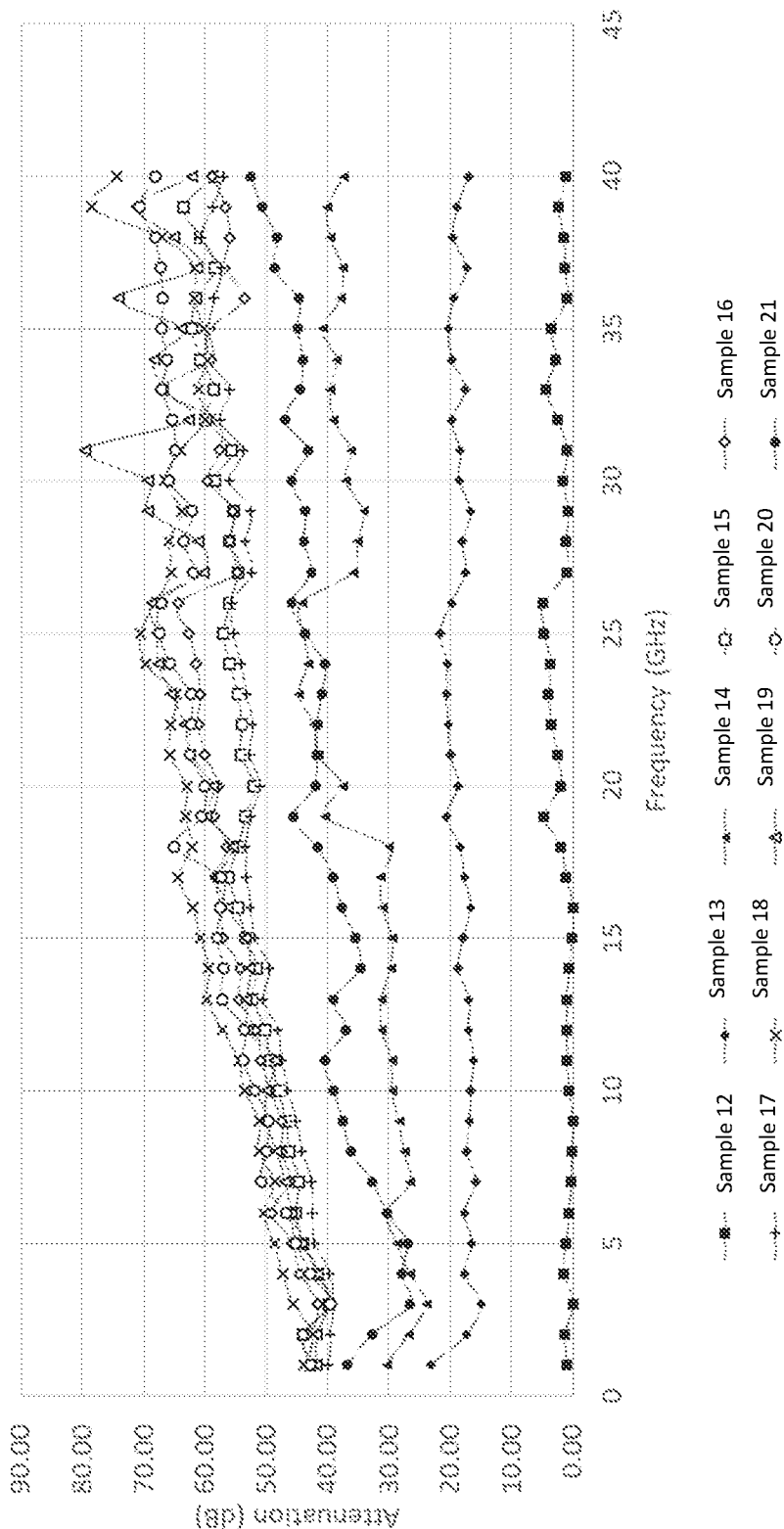
FIG. 9 shows a graph of shielding effectiveness in decibels verses an emitted test frequency in GHz for twelfth to twenty-first EMI filtering samples.
Figure 10:
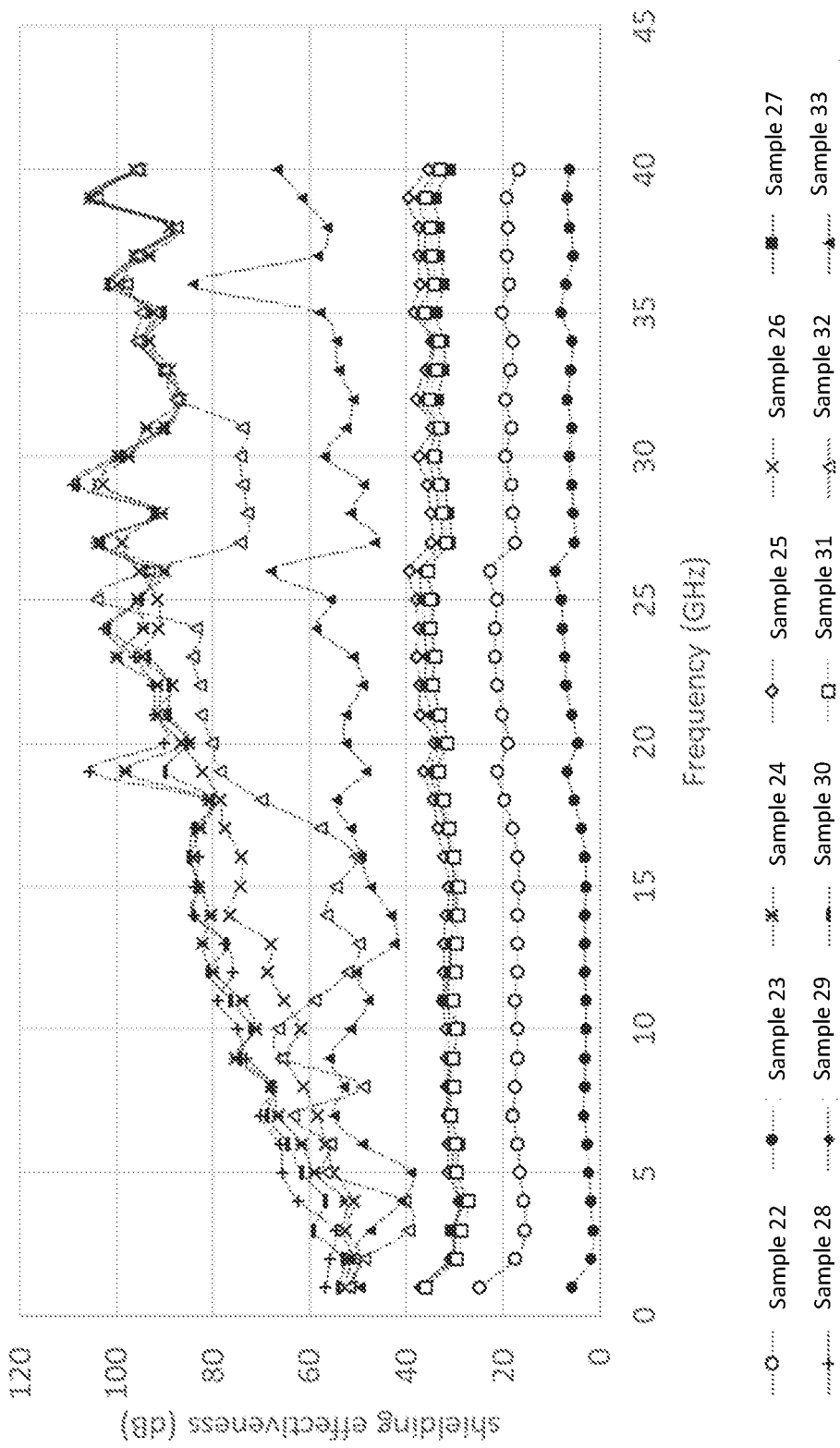
FIG. 10 shows a graph of shielding effectiveness in decibels verses an emitted test frequency in GHz for twenty-second to thirty-third EMI filtering samples.
Figure 11:
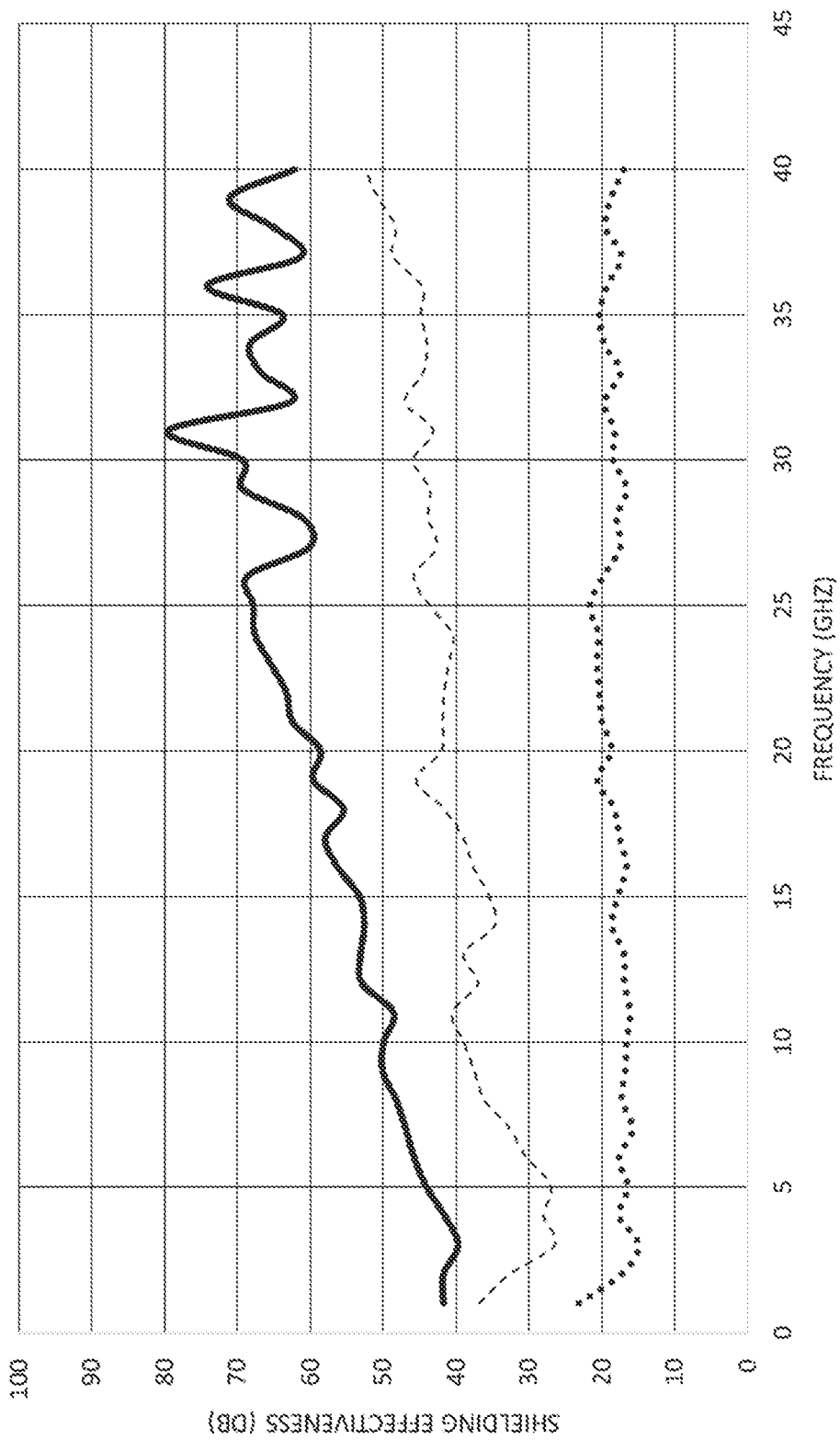
FIG. 11 shows a graph of shielding effectiveness in decibels verses an emitted test frequency in gigahertz (GHz) for 3 EMI filtering samples of different thicknesses.
Figure 12:
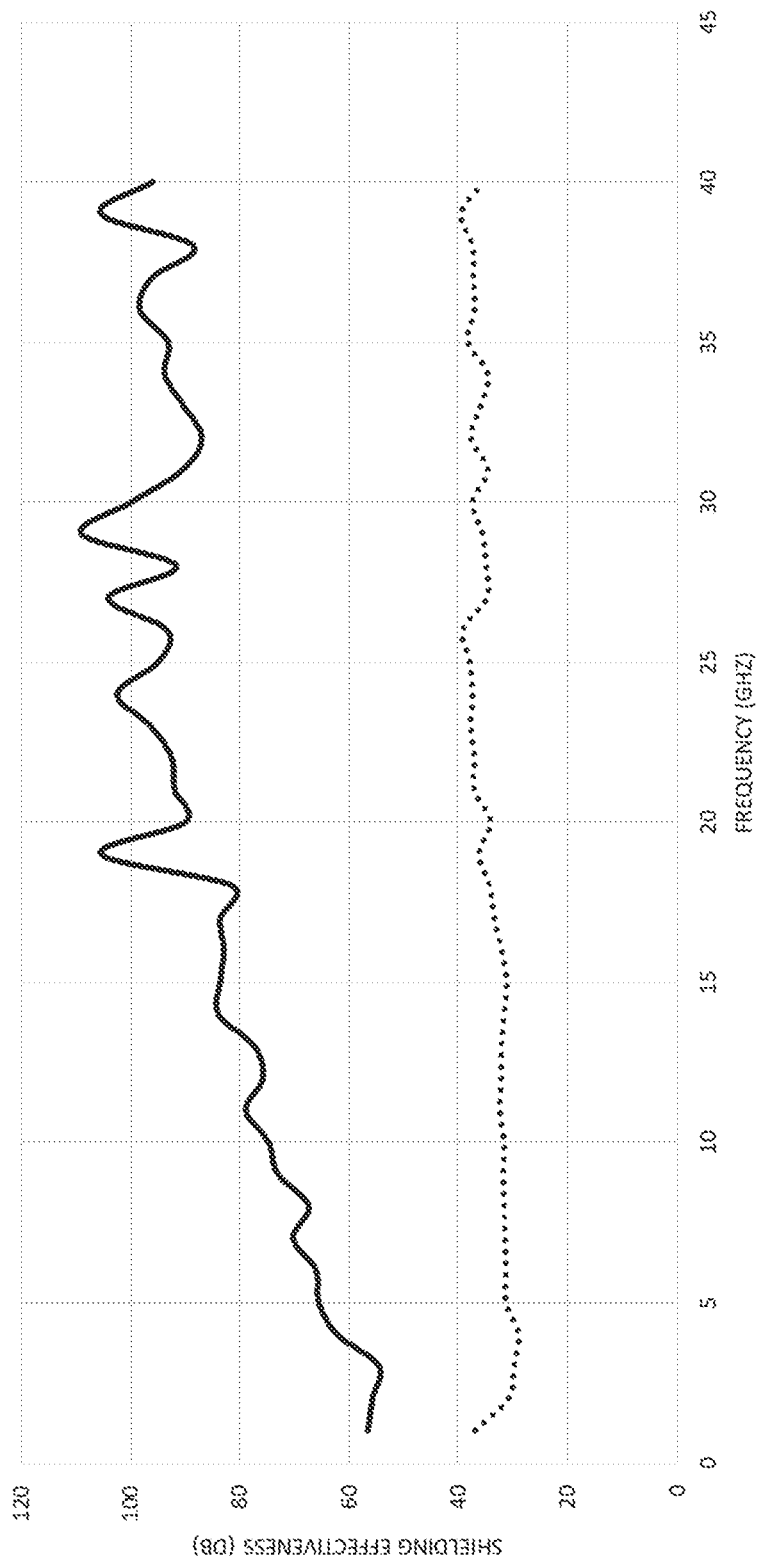
FIG. 12 shows a graph of shielding effectiveness in decibels verses an emitted test frequency in GHz for 3 EMI filtering samples.
Figure 13:
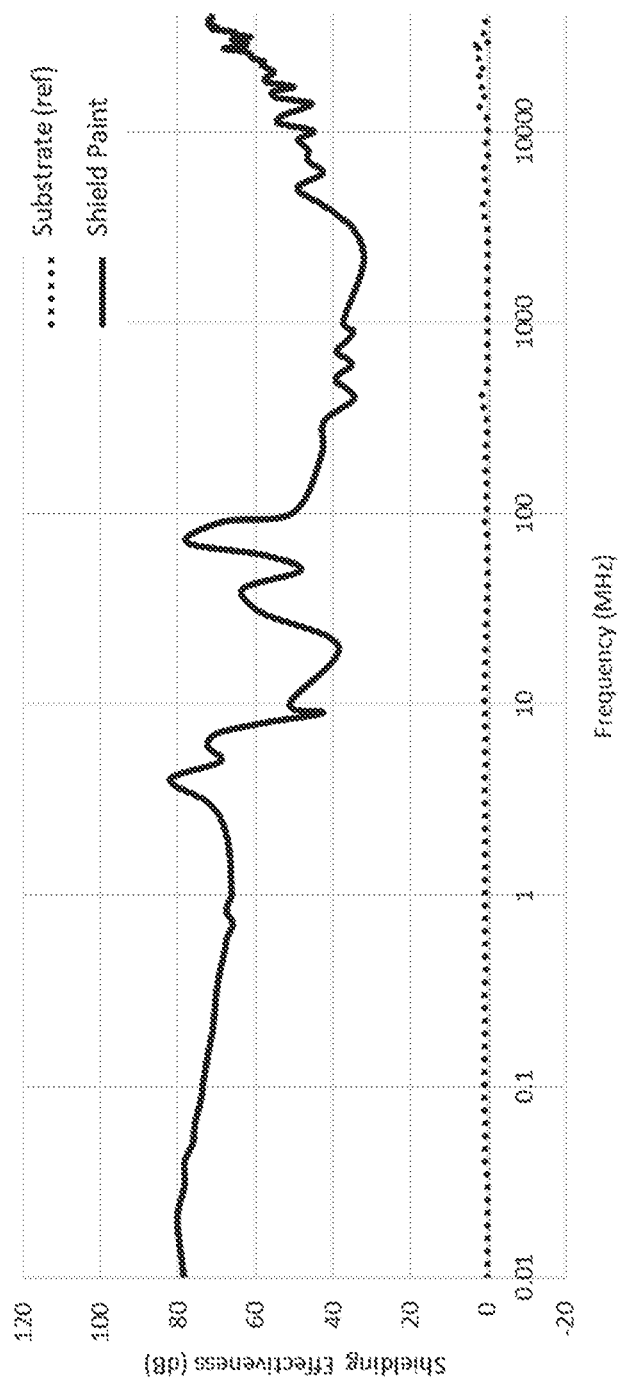
FIG. 13 shows a graph of shielding effectiveness in decibels verses an emitted test frequency in GHz for an exemplary filtering sample.

FIG. 8 shows a graph of shielding effectiveness in decibels verses an emitted test frequency in megahertz (MHz) for sixth to eleventh EMI filtering samples. FIG. 9 shows a graph of shielding effectiveness in decibels verses an emitted test frequency in GHz for twelfth to twenty-first EMI filtering samples. FIG. 12 shows a graph of shielding effectiveness in decibels verses an emitted test frequency in GHz for twenty-second to thirty-third EMI filtering samples. FIG. 13 shows a graph of shielding effectiveness in decibels verses an emitted test frequency in gigahertz (GHz) for 3 EMI filtering samples of different thicknesses. FIG. 14 shows a graph of shielding effectiveness in decibels verses an emitted test frequency in GHz for 3 EMI filtering samples. FIG. 13 shows a graph of shielding effectiveness in decibels verses an emitted test frequency in GHz for an exemplary filtering sample.

Example 2—First Method Forming a Coating 500-600 grams of carboxymethyl cellulose solution was mixed in with 360-370 grams of a styrene butadiene rubber binder along with about 200 ml of Water. 30-40 grams of C45 was added and mixed. 1350-1450 grams of graphite was added in the three equal portions with 100-200 mL of water and mixed using low speed mechanical stirring (50-100 rpm). Once all graphite powders were mixed in, 25-35 grams of carbon fiber and 25-35 grams of rGO powders were added and mixed via high-shear mechanical mixing (1000-4000 rpm). Water was added to achieve the desired rheology (2000-5000 cP) and solid content of the coating.

Example 3—Second Method Forming a Coating 300-400 grams of carboxymethyl cellulose binder aqueous solution and 550-650 grams of 15% styrene butadiene rubber binder were added into the mixer along with 200 ml of water and mixed via low speed mechanical stirring (50-100 rpm). 25-35 grams of C45, 25-35 grams of carbon fiber, and 25-35 grams of rGO were ground in a powder grinder and mixed into the binder solution via low speed stirring. A total of about 1350-1450 g of graphite was added in the three equal portions with 100-200 mL of water and mixed into the coating using low speed mechanical stirring. Once all powders were mixed in, the coating was mixed via high-shear mechanical mixing (1000-4000 rpm). Water was added to achieve the desired rheology (2000-5000 cP) and solid content of the coating.

Example 4—Third Method Forming a Coating 1400-1500 grams of 15% styrene butadiene rubber binder was added into the mixer with 200 ml of water and mixed via low speed mechanical mixing (50-100 rpm). 40-50 grams of C45, 40-50 grams g of carbon fiber, and 40-50 grams g of rGO were ground in a powder grinder and mixed into the binder solution via low speed stirring. A total of 1500-2500 grams of graphite was added in the three equal portions with 150-250 mL of water and mixed into the coating using low speed mechanical stirring (50-100 rpm). Once all powders were mixed in, the coating was mixed via high-shear mechanical mixing (1000-4000 rpm). Water was added to achieve the desired rheology (2000-5000 cP) and solid content of the coating.

Example 5—Method of Forming a Coated Film

A clearcoat and an activator, both of which were mixed using a planetary mixer. 2000-2500 grams of graphite, 50-150 grams of CNT(OH), 200-250 g of carbon fiber, and 50-60 g of Freeze-dried rGO were ground in a powder mixer. Half of the powders were transferred, in two portions, into about 1500-2500 grams of polyurethane clearcoat and mixed using low speed mechanical mixing. The other half of the powders were added in 2 portions into 1500-2500 grams of polyurethane activator via slow mechanical mixing. A reducer was added to adjust the rheology of the slurries. To make films, the clearcoat and the activator were combined in a 1:1 volume ratio, hand mixed or shaken briefly and transferred into a spray gun canister with a built-in agitator. Multiple thin coats were sprayed to achieve the desired dry film thickness.

Example 6—Method of Forming a Coating

A slurry was made using a planetary mixer typically used in lithium ion battery industry. 1400-1600 g of 63% acrylic binder aqueous binder solution was added into the mixer along with 370-430 ml of water and mixed via low speed mechanical stirring (50-100 rpm). About 40-50 g of carbon fiber, 40-50 g of carbon black, and 5-15 g of rGO were ground in a powder grinder and mixed into the binder solution via low speed stirring. A total of 2000-2300 g of graphite and 800-1000 mL of a water-based carboxylated styrene acrylic latex (48% solid) were added in the three equal portions and mixed into the slurry using low speed mechanical stirring. Once all powders were mixed in, the slurry was mixed via high-shear mechanical mixing (1000-4000 rpm). Water was added to achieve the desired rheology and solid content of the slurry. The final viscosity is between 1000-2000 cP. The conductivity is typically about 150-180 S/m. An example of the slurry composition is provided in the table below.

TABLE 2

| Example slurry ingredient ranges | | | | | | | | |
|---|---|---|---|---|---|---|---|---|
| Rustoleum 710 | Trinseo 9501 | Graphite(g) | Cabot CB (g) | PX30(g) | RGO (g) | Total (g) | Water (g) | Solid content |
| 1400-1600 | 800-1000 | 2000-2300 | 40-50 | 40-50 | 5-15 | 4285-5015 | 370-430 | ~61-84% |
| 882-1008 | 384-480 | 2000-2300 | 40-50 | 40-50 | 5-15 | 3351-3901 | 0 | 100% |
| 22-31% | 9-15% | 51-69% | 1-2% | 1-2% | 0.1-1% | 100.00% | | |

Table 2 shows the respective amounts of each ingredient with the total wet weight in the first row, the dry weight in the second row, and the percentage of each ingredient with respect to the dry weight in the third row.

What is claimed is:

1. A method of forming an electromagnetic shield comprising:
   (a) forming a coating comprising:
      (i) at least about 20% by mass of a conductive additive comprising reduced graphene oxide sheets, graphene oxide sheets, carbon black, and graphite;
      (ii) a binder;
      (iii) a solvent;
      (iv) a surfactant; and
      (v) a defoamer;
   (b) depositing the coating on a substrate; and
   (c) drying the coating on the substrate, thereby forming the electromagnetic shield.
2. The method of claim 1, wherein the coating further comprises a viscosity modifier.
3. The method of claim 1, wherein the forming of the coating comprises:
   (a) mixing the coating;
   (b) breaking down agglomerates in the coating;
   (c) removing air bubbles from the coating; or
   (d) any combination thereof.
4. The method of claim 1, wherein depositing the coating on a substrate comprises depositing the coating on the substrate with a coating machine, a doctor's blade, a tabletop coater, an air sprayer, or any combination thereof.
5. The method of claim 3, wherein at least one of the breaking down of the agglomerates in the coating and the removing of the air bubbles from the coating is performed until the coating has a viscosity of about 1,000 mPa/s to about 5,000 mPa/s.
6. The method of claim 1, wherein the conductive additive comprises a carbon-based additive.
7. The method of claim 6, wherein the carbon-based additive comprises graphite, graphene, reduced graphene, graphene oxide, reduced graphene oxide, carbon black, cabot carbon, a carbon nanotube, a functionalized carbon nanotube, or any combination thereof.
8. The method of claim 6, wherein the carbon-based additive comprises a carbon nanotube, or a functionalized carbon nanotube.
9. The method of claim 8, wherein the carbon nanotube is a multiwalled carbon nanotube.
10. The method of claim 8, wherein the functionalized carbon nanotube is functionalized with hydroxide, carboxylie acid, or both.
11. The method of claim 8, wherein the carbon nanotube comprises an outside diameter of about 20 nm to about 60 nm.
12. The method of claim 8, wherein the carbon nanotube comprises a specific surface area of greater than about 60 $m^2/g$.
13. The method of claim 8, wherein the carbon nanotube has an electrical conductivity of greater than about 100 S/cm.
14. The method of claim 6, wherein the carbon-based additive has a mean particle size of about 2 μm to about 30 μm.
15. The method of claim 6, wherein the carbon-based additive comprises a specific surface area of about 2 $m^2/g$ to about 16 $m^2/g$.
16. The method of claim 1, wherein the solvent comprises a polar aprotic solvent comprising N-Methyl-2-pyrrolidone, dichloromethane, tetrahydrofuran, ethyl acetate, acetone, dimethylformamide, acetonitrile, dimethyl sulfoxide, propylene carbonate, or any combination thereof.
17. The method of claim 1, wherein the solvent comprises a polar protic solvent comprising water, formic acid, n-butanol, isopropanol, nitromethane, ethanol, methanol, acetic acid, or any combination thereof.
18. The method of claim 1, wherein drying the coating on the substrate comprises drying at a temperature of about 20° C. to about 120° C.

19. The method of claim 3, further comprising breaking down agglomerates and removing air bubbles from the coating, wherein the breaking down agglomerates in the coating is performed by high shear mixing, and wherein the removing air bubbles from the coating is performed by vacuum mixing.

20. The method of claim 1, further comprising calendaring the electromagnetic shield by a roll to roll calendaring machine.

* * * * *